US008089080B2

(12) United States Patent
Calder et al.

(10) Patent No.: US 8,089,080 B2
(45) Date of Patent: Jan. 3, 2012

(54) ENGINEERED STRUCTURE FOR HIGH BRIGHTNESS SOLID-STATE LIGHT EMITTERS

(75) Inventors: Iain Calder, Kanata (CA); Carla Miner, Carp (CA); George Chik, Nepean (CA); Thomas Macelwee, Nepean (CA)

(73) Assignee: Group IV Semiconductor, Inc., Ottawa, Ontario (CA)

( * ) Notice: Subject to any disclaimer, the term of this patent is extended or adjusted under 35 U.S.C. 154(b) by 266 days.

(21) Appl. No.: 12/508,033

(22) Filed: Jul. 23, 2009

(65) Prior Publication Data

US 2010/0032687 A1 Feb. 11, 2010

Related U.S. Application Data

(63) Continuation-in-part of application No. 11/642,788, filed on Dec. 21, 2006, said application No. 12/508,033 is a continuation-in-part of application No. 12/015,285, filed on Jan. 16, 2008, now Pat. No. 7,888,686, which is a continuation-in-part of application No. 11/642,813, filed on Dec. 21, 2006, now Pat. No. 7,800,117.

(60) Provisional application No. 60/754,185, filed on Dec. 28, 2005, provisional application No. 60/786,730, filed on Mar. 29, 2006, provisional application No. 61/083,751, filed on Jul. 25, 2008.

(51) Int. Cl.
*H01L 33/00* (2010.01)

(52) U.S. Cl. ..................... 257/89; 257/88; 257/E33.012

(58) Field of Classification Search .................... 257/78, 257/89, 88, E33.012

See application file for complete search history.

(56) References Cited

U.S. PATENT DOCUMENTS 5,248,890 A 9/1993 Luth et al. .................... 257/102
5,381,434 A 1/1995 Bhat et al. ................ 372/45.011

(Continued)

FOREIGN PATENT DOCUMENTS

EP 1134799 9/2001

(Continued)

OTHER PUBLICATIONS

J. M. Sun et al. "Bright green electroluminescence from $Tb^{3+}$ in silicon metal-oxide-semiconductor devices", Appl. Phys. Lett. 97, 123513 (2005).

(Continued)

*Primary Examiner* — Marcos D. Pizarro
*Assistant Examiner* — Eva Yan Montalvo
(74) *Attorney, Agent, or Firm* — Teitelbaum & MacLean; Neil Teitelbaum; Doug MacLean

(57) ABSTRACT

Electroluminescent (EL) light emitting structures comprises one or more active layers comprising rare earth luminescent centers in a host matrix for emitting light of a particular color or wavelength and electrodes for application of an electric field and current injection for excitation of light emission. The host matrix is preferably a dielectric containing the rare earth luminescent centers, e.g. rare earth doped silicon dioxide, silicon nitride, silicon oxynitrides, alumina, dielectrics of the general formula $Si_aAl_bO_cN_d$, or rare earth oxides. For efficient impact excitation, corresponding drift layers adjacent each active layer have a thickness related to a respective excitation energy of an adjacent active layer. A stack of active layers emitting different colors may be combined to provide white light. For rare earth species having a host dependent emission spectrum, spectral emission of the stack may be tuned by appropriate selection of a different host matrix in successive active layers.

23 Claims, 12 Drawing Sheets

U.S. PATENT DOCUMENTS

| | | | | |
|---|---|---|---|---|
| 5,796,120 | A | 8/1998 | Summers et al. | 257/30 |
| 5,920,086 | A | 7/1999 | MacFarlane et al. | 257/103 |
| 6,608,328 | B2 | 8/2003 | Kuo et al. | 257/79 |
| 6,756,289 | B1 | 6/2004 | Nakagawa et al. | 438/478 |
| 6,898,215 | B2 | 5/2005 | Naone et al. | 372/4 |
| 7,081,664 | B2 | 7/2006 | Hill | 257/607 |
| 7,098,414 | B2 * | 8/2006 | Caldwell | 200/310 |
| 7,122,842 | B2 | 10/2006 | Hill | 257/86 |
| 2004/0151461 | A1 | 8/2004 | Hill | 385/129 |
| 2004/0214362 | A1 | 10/2004 | Hill et al. | 438/33 |
| 2004/0252738 | A1 | 12/2004 | Hill | 372/43.01 |
| 2005/0041434 | A1 | 2/2005 | Yatsuda et al. | 362/459 |
| 2005/0088853 | A1 | 4/2005 | Yatsuda et al. | 362/545 |
| 2005/0224813 | A1 | 10/2005 | Liu et al. | 257/79 |
| 2008/0093608 | A1 | 4/2008 | Chik | 257/89 |
| 2008/0246046 | A1 | 10/2008 | Chik et al. | 257/98 |
| 2009/0128029 | A1 | 5/2009 | MacElwee et al. | 313/509 |

FOREIGN PATENT DOCUMENTS

| | | |
|---|---|---|
| WO | 02/061815 | 8/2002 |

OTHER PUBLICATIONS

C.E. Chryssou, et al, "$Er^{3+}$ -Doped $A1_2O_3$ thin films by plasma-enhanced chemical vapor deposition (PECVD) Exhibiting a 55-nm Optical Bandwidth" IEEE J. Quantum Electron. 34, 282 (1988).

Yeong Yuh Chen, et al. "High Quality $A1_2O_3$ IPD with $NH_3$ surface nitridation" IEEE Electron Dev. Lett. 24, 503 (2003).

* cited by examiner

ENGINEERED STRUCTURE FOR HIGH BRIGHTNESS SOLID-STATE LIGHT EMITTERS

CROSS-REFERENCE TO RELATED APPLICATIONS

This application is a continuation-in-part of U.S. patent application Ser. No. 11/642,788 filed Dec. 21, 2006, entitled "Engineered structure for solid state light emitters" claiming priority from U.S. Provisional patent application No. 60/754,185 filed Dec. 28, 2005 and No. 60/786,730 filed Mar. 29, 2006; this application is also a continuation-in-part of U.S. patent application Ser. No. 12/015,285 filed Jan. 16, 2008 now U.S. Pat. No. 7,888,686 entitled "Pixel structure for a solid state light emitting device" which is a continuation in part of U.S. patent applications No. 11/642,813 filed Dec. 21, 2006 now U.S. Pat. No. 7,800,117, claiming priority from U.S. Provisional patent application No. 60/754,185 Dec. 28, 2005; this application also claims priority from U.S. provisional application No. 61/083,751 filed Jul. 25, 2008 entitled "Solid state light emitters using rare earths and aluminum"; all of these applications are incorporated herein by reference for all purposes.

TECHNICAL FIELD

This invention relates to electroluminescent light emitting devices, and in particular to engineered structures for light emitters comprising rare earth luminescent centers in a host matrix, for applications such as solid-state lighting requiring high brightness.

BACKGROUND OF THE INVENTION

The next generation of solid-state lighting is seeking to provide advances in brightness, efficiency, color, purity, packaging, scalability, reliability and reduced costs. The creation of light emitting devices from silicon based materials, upon which the modern electronic industry is built, has been the subject of intensive research and development around the world. To overcome the inherent low efficiency of light emission from indirect bandgap materials, such as bulk silicon and other group IV semiconductor materials, extensive research has been directed to nanostructures, i.e. nano dots, nanocrystals and superlattice structures, and materials comprising silicon nanocrystals and/or other luminescent centres, such as rare earth ions, in a suitable host matrix. Structures comprising the latter materials are disclosed in related copending U.S. published applications publication No. 20080093608 entitled "Engineered structure for solid state light emitters" and No. 20080246046 entitled "Pixel structure for a solid state light emitting device", and references cited therein.

Rare earth elements have been employed in various forms of illumination sources for decades. It is well known that the rare earth elements can emit infrared, visible and ultraviolet light when exited optically or electrically. For example, rare earth doped glass has been used for many years as phosphors, in solid-state lasers, and fibre based optical amplifiers. In these devices, the rare earth dopants in a glass host matrix material act as luminescent centres that absorb and emit radiation at specific wavelengths that are determined by the valence state of the ion, and are, to a large degree, independent of the host in which the ions sits. The colour of the emission is characteristic of the particular rare earth species. For example, erbium and terbium emit in the green, europium emits in the red, cerium and thulium emit in the blue regions of the visible spectrum. By using a selection of different rare earth elements, the individual colours can be combined in predetermined ratios to emit various colours, or white light of a desired colour rendering index (CRI).

Rare earths have been used in gaseous form where they are excited through a high voltage gas discharge, or as solid phosphors, in which they are excited by another light source operating in the deep blue or ultraviolet.

More recently various laboratories have looked at applying rare earths to solid-state lighting sources, and particularly white light emitters using electroluminescent devices fabricated using silicon or other Group IV semiconductors. For example, U.S. Pat. No. 7,122,842 to Hill, entitled "Solid state white light emitter and display using same" discloses a white light emitter comprising layers of rare earth doped group IV semiconductor nanocrystal material, wherein each layer is doped with a different rare earth dopant to collectively emit visible light. An article entitled "Bright green electroluminescence from $Tb^{3+}$ in silicon metal oxide semiconductor devices" by J. M. Sun et al., Appl. Phys. Lett. 97, 123513 (2005) discloses visible light emission from terbium doped silicon dioxide.

Methods for deposition of rare earth doped group IV nanocrystal materials are disclosed in U.S. Pat. No. 7,081,644, to Hill, entitled "Doped Semiconductor Powder and Preparation thereof". Rare earth containing oxides, or rare earth doped oxides, can be formed by any of a number of techniques such as ion implantation, chemical vapour deposition, physical vapour deposition (i.e. sputtering), spin-on (sol gel) techniques, beam deposition, laser deposition, or any of a large number of similar chemical or physical deposition techniques that are generally well known in the thin film or semiconductor technology fields.

The generation of light from electroluminescent solid state light emitting devices (EL devices), as generally described in this application, and related copending applications, is based on applying energy from an electric field to a light emitting structure including an active region or emissive layer. Active layers may comprise a wide band gap semiconductor or dielectric e.g. silicon nitride, silicon dioxide, or GaN, including luminescent centres, such as semiconductor nanocrystals and/or luminescent rare earth species. It is important to deliver a minimum and controlled amount of electron energy for excitation of luminescent centres in an active light emitting layer in the device. If the energy of incident electrons is too low there will be no light emission possible. On the other hand, if the electrons possess too much energy there will be light emission but excess energy will be carried away in the form of heat, which reduces efficiency. Furthermore, hot electrons can be responsible for damage to the host matrix, result in charging, and ultimately contribute to breakdown and failure of the device under bias.

There has been particular interest in rare earth doped nano-particle materials because silicon nano-particles act as classical sensitizer atoms that absorb incident photons or electrons and then transfer the energy to the rare earth ions, which then fluoresce in the infrared or visible wavelength ranges, with several advantages compared to the direct fluorescence of the rare earth. First, the absorption cross-section of the silicon nano-particles is larger than that of the rare earth ions by more than three orders of magnitude. Second, as excitation occurs via an Auger-type interaction or via a Forster transfer process between carriers in the silicon nanoparticles and rare earth ions, incident photons need not be in resonance with one of the narrow absorption bands of the rare earth luminescent centers. Unfortunately, existing approaches to developing such silicon nano-particle materials have only been successful at producing very low concentrations of the rare earth element, which are not sufficient for many practical applications. Also, silicon nano-particles formed by such techniques generally have a relatively narrow distribution of photo-luminescent (PL) wavelength or energy despite the broad size distribution, i.e. the observed energies are not as high as expected from the quantum confinement of the nanocrystals. The reduced nano-particle excitation energy affects the efficiency of energy transfer from conducting electrons when these structures are electrically powered, thereby limiting the efficiency of light generation from such films.

As described in detail copending published patent application No. 20080093608 since the excitation energy and emission wavelength of nanoparticles or nanocrystals is dependent on the nanoparticle size and size distribution, the thickness of each active layer comprising nanoparticles may be selected to control the size and uniformity of nanoparticles. In practice, however, careful control of deposition parameters, layer thickness, and thermal treatments is needed to control the size, uniformity and passivation of nanocrystal layers to obtain a desired emission wavelength and excitation energy, otherwise significant emission may be observed from lower energy interfacial states, resulting in loss of efficiency.

For rare earth optical centres, higher concentrations (e.g. densities of greater than 4% for Tb, or less for other rare earth species) give rise to quenching of optical centres due to cross relaxation and clustering effects (J. Sun et al., J. Appl. Phys. 97, 123513 (2005)).

Thus, problems with known device structures and processes based on luminescent centres comprising rare earths and/or nanocrystals include inconsistent size, quality and uniformity of nanocrystals to obtain a desired wavelength of emission or excitation energy; quenching of emission from rare earth luminescent species at higher concentrations, and poor efficiency of excitation of luminescent centres either directly or by energy transfer from nano-particles to rare earth luminescent centres. In particular, energy mismatches lead to poor excitation efficiency, i.e. if the excitation energy is too low, luminescent centers are not effectively excited, and if the excitation energy is too high, then energy is wasted in the excitation process.

It is desirable to overcome the above mentioned limitations and further improve the performance and efficiency of light emitting devices, particularly those based on silicon and other Group IV materials, which are compatible with silicon process technology, so as to provide alternatives to known solid state light emitting devices, such as those based on conventional direct band gap II-VI or III-V materials.

Thus, there is a need for alternative or improved materials, structures and/or methods of fabrication for solid-state light emitters, particularly for applications requiring higher brightness, luminous efficacy and reliability, such as solid state lighting.

SUMMARY OF INVENTION

Consequently, the present invention seeks to overcome or mitigate the above-mentioned problems relating to solid-state light emitters, or at least provide an alternative.

One aspect of the present invention provides an electroluminescent light emitting structure comprising:

an active layer comprising rare earth luminescent centers in a dielectric host matrix for emitting light of a characteristic wavelength, and electrodes for applying an electric field for excitation of light emission, wherein the host matrix is selected from the group consisting of aluminum oxide, aluminum doped silicon dioxide, silicon oxynitrides, aluminum containing oxides of the general formula $Si_1Al_bO_c$, and aluminum containing oxynitrides of the general formula $Si_aAl_bO_cN_d$.

The light emitting structure may further comprise a drift layer comprising a wide bandgap semiconductor or dielectric material adjacent the active layer, the drift layer having thickness relative to the electric field dependent on a respective excitation energy of the adjacent active layer, for controlling electron energy gain from the electric field for exciting light emission at the characteristic wavelength. On application of the electric field, electrons gain energy in the drift layer to provide for excitation, e.g. by impact excitation or impact ionization, at the appropriate excitation energy.

Another aspect of the invention provides a electroluminescent light emitting structure comprising:

a layer stack comprising:

- a plurality of active layers, each comprising rare earth luminescent centers in a dielectric host matrix for emitting light of a characteristic wavelength by excitation with a respective excitation energy;
- a corresponding drift layer comprising a wide bandgap semiconductor or a dielectric material adjacent each active layer; and electrodes for applying an electric field to the layer stack for excitation of light emission.

Preferably, each active layer comprises a dielectric host matrix doped with one or more rare earth luminescent species, and the dielectric host matrix is selected from the group consisting of silicon dioxide, silicon nitride, aluminum oxide, aluminum doped silicon dioxide, silicon oxynitrides, aluminum doped silicon oxynitrides, aluminum containing oxides of the general formula $Si_xAl_yO_z$, and aluminum containing oxynitrides of the general formula $Si_aAl_bO_cN_d$. Alternatively, the active layers may comprise a rare earth oxide host matrix comprising said rare earth luminescent species.

Since silicon nitride and other nitrogen containing dielectrics tend to have a higher trap density, suitable compatible dielectrics which do not contain nitrogen are preferred for the drift layers, particularly silicon dioxide, or aluminum oxide Advantageously, each drift layer has thickness relative to the electric field dependent on the respective excitation energy of an adjacent active layer, for controlling electron energy gain from the electric field for exciting light emission at the characteristic wavelength, and preferably the thickness is substantially equal to the required excitation energy divided by the electric field. Electrons traversing the drift layer gain energy from the electric field for excitation of the luminescent centers in an adjacent active layer at the respective excitation energy. In the ballistic regime, electrons gain energy e in the drift layers (in eV) equal to the electric field E (V/nm) multiplied by the thickness of the drift layer d. (nm). Preferably, each drift layer has a thickness that provides improved energy matching or tuning of the respective excitation energy for an adjacent active layer, thereby improving excitation efficiency and luminous efficacy.

Since the device operates at a relatively high electric field ~5 MV/cm, high quality oxides or dielectrics are required for both the active layers and drift layers. Thus for example, in some preferred embodiment active layers comprise stoichiometric silicon dioxide ($SiO_2$) or silicon nitride ($Si_3N_4$) doped with a rare earth luminescent centre such as cerium, terbium or europium. The corresponding drift layers may comprise silicon dioxide or silicon nitride, although silicon dioxide is preferred. In another embodiment the host matrix material in active layers comprises aluminum oxide, and the drift layer dielectric comprise silicon dioxide, aluminum oxide, or aluminum doped silicon dioxide. Aluminum containing dielectrics, e.g. aluminum oxide, or SiAlON, may reduce clustering of rare earths, and allow high concentrations of luminescent centres to be incorporated before concentration quenching is observed. An aluminum oxide based structure is also believed to provide advantages for some applications because of the lower bandgap and conduction band offset or higher dielectric constant, and higher thermal conductivity relative to silicon dioxide are beneficial.

Typically, the emission wavelength or colour, and correspondingly the respective excitation energy, of each active layer is characteristic of the particular rare earth luminescent species. In some examples, the emission wavelength of particular rare earth species e.g. cerium or europium, may be dependent on the host matrix, and the emission wavelength may be tuned by selection of an appropriate host matrix material or composition.

By using different host matrix materials, the emission spectrum of specific rare earth species, e.g. cerium, may be tuned to red shift or blue shift the emission. For example, in a silicon oxynitride or silicon nitride host matrix, the emission spectrum of cerium may be significantly red shifted relative to cerium doped silicon dioxide. Thus, a suitable host matrix may shift emission to provide a greater proportion of emission into the visible region, or a desired spectral range.

When the layer stack comprises a plurality of active layers, one or more first active layers may comprise rare earth luminescent centres in a dielectric host matrix for emitting light of a first wavelength or colour on excitation by a respective first excitation energy and may further comprise one or more second active layers comprising rare earth luminescent centers in a dielectric host matrix material for emitting light at a second wavelength or colour, and requiring a respective second excitation energy. Corresponding drift layers may be provided with appropriate first and second thicknesses to provide respective first and second excitation energies.

In a structure comprising a layer stack comprising a plurality of active layers for emitting light of different colours, e.g. red, green and blue respectively, active layers comprising different rare earth species and/or host matrices may be combined to provide white light of a desired colour rendering index.

In multilayer structures, each active layer may have the same composition, comprising a similar host matrix material and a luminescent rare earth dopant, and emit light of the same colour or wavelength. Active layers may comprise one or more rare earth dopants. Alternatively, different active layers may comprise the same dielectric host matrix and be doped with one or more different rare earth species for light emission at different wavelengths, which may be selected to collectively provide light of a desired colour or CRI.

Beneficially, when the emission spectrum of a rare earth luminescent centre is dependent on the host matrix material, an appropriate selection of rare earth dopant and host matrix material in each layer provides for tuning of the emission wavelength and/or excitation energy of the active layer. Thus an emitter layer structure may be provides comprising a first active layer comprising a first rare earth luminescent species in a first host matrix, and a second active layer comprising the same rare earth luminescent species in a second, different, host matrix.

In some structures the composition of the dielectric host matrix is selected to shift the emission wavelength in each of a plurality of active layer dependent on the host material composition. For example, a layer stack comprising a plurality of active layers may comprises active layers each doped with a first rare earth species having an emission wavelength dependent on the composition of the dielectric $Si_aAl_bO_cN_d$, and successive active layers have different composition (i.e. values of a, b, c, and d are varied) to provide emission at a plurality of wavelengths. Such a structure is beneficial where improved control of the emission spectrum and wavelength over a narrow or broad range is required. Varying the composition of the host matrix material in different layers of the stack may provide for spectral tuning, for example, when it is desirable to use a limited number of rare earth dopants, a limited number of layers, or to provide for extended range of spectral tuning with one or multiple rare earth dopants.

Layer stacks may comprise one or more active layers emitting one wavelength or colour, or a plurality of active layers emitting different colours or wavelengths, which may be combined to provide a desired spectral output or colour rendering index (CRI). In preferred structures, the layer stack may comprises a first set of layers may emit light of a first colour or wavelength, a second set of layers may emit light of a second colour or wavelength, and a third set of layers may emit light of a third colour or wavelength. Layers may be arranged in order of wavelength of emission, e.g. each set of layers may be grouped together to form a layer stack, or layers emitting different colours may be otherwise arranged, grouped, or interleaved.

In some embodiments, active layers may be doped with more than one rare earth luminescent species, the drift layer thickness being matched to the excitation energy of the primary RE dopant, and another RE dopant being provided e.g. requiring a lower excitation energy to take advantage of electrons at the lower range of energies.

Another aspect of the invention provides a method of fabricating an electroluminescent light emitting structure for operation at a predetermined electric field, comprising: providing a substrate and depositing thereon at least one layer pair, comprising an active layer comprising rare earth luminescent centers in a dielectric host matrix for emitting light at a characteristic wavelength on excitation with respective excitation energy and a corresponding drift layer comprising a dielectric material, with a thickness corresponding to the respective excitation energy divided by the electric field. The method may also comprise providing electrode layers for excitation of the at least one layer pair by application of said electric field.

A further aspect of the invention provides a method of fabricating a light emitting structure comprising: providing a substrate and depositing thereon a plurality of layer pairs, each comprising an active layer comprising a rare earth doped dielectric host matrix material of composition $RE:Si_aAl_bO_cN_d$ where RE is a rare earth element selected for emission of light of a specific wavelength dependent on the composition of the host matrix material, on excitation with a respective excitation energy, and a corresponding drift layer comprising a dielectric composition $Si_xAl_yO_z$ with a thickness dependent on the said respective excitation energy of the active layer.

Embodiments of the light emitting structure may comprise a layer stack comprising one or more active layer/drift layer pairs, wherein the drift layers are configured as appropriate for DC or for AC operation.

Engineered emitter layer structures according to embodiments of the invention provide significant improvements in luminous efficacy and brightness over bulk structures comprising nanocrystals and/or rare earth luminescent centers, and conventional thin film electroluminescent devices.

Embodiments of the invention will now be described, by way of example, with reference to the following drawings.

DETAILED DESCRIPTION OF PREFERRED EMBODIMENTS

Figure 1A:
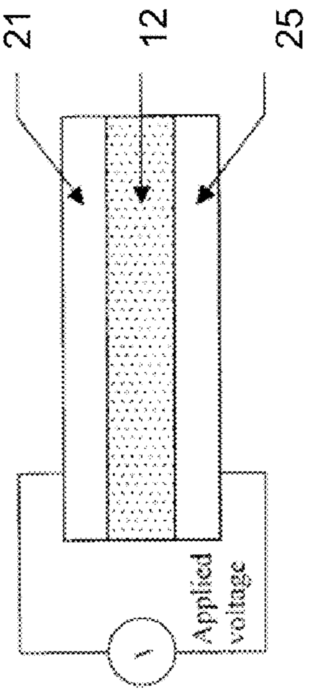
FIGS. 1 and 1A show simplified schematic representations of an electroluminescent device structure.

As shown schematically in FIG. 1A, a simple type of electroluminescent light emitting device comprises an active region or layer 12, comprising luminescent centres which may be electrically excited, and first and second electrode layers 21 and 25 for applying a suitable electric field for excitation of the active layer 12. The active layer 12 may comprise a material such as rare earth doped silicon dioxide, and be ~10 nm to ~1000 nm thick, for example. Electrons are accelerated by the applied electric field and when they collide with the luminescent centres, if sufficiently energetic, transfer energy to excite the luminescent centres, by impact excitation, to cause light emission at a wavelength characteristic of the particular rare earth species. The applied voltage may be DC or AC, but AC is preferred. However when the luminescent centres are rare earth species, such as cerium or terbium, in a host matrix such as silicon dioxide, such a structure such as shown in FIG. 1 tends to provide low excitation efficiency and offers limited luminous efficacy and brightness.

Figure 1:
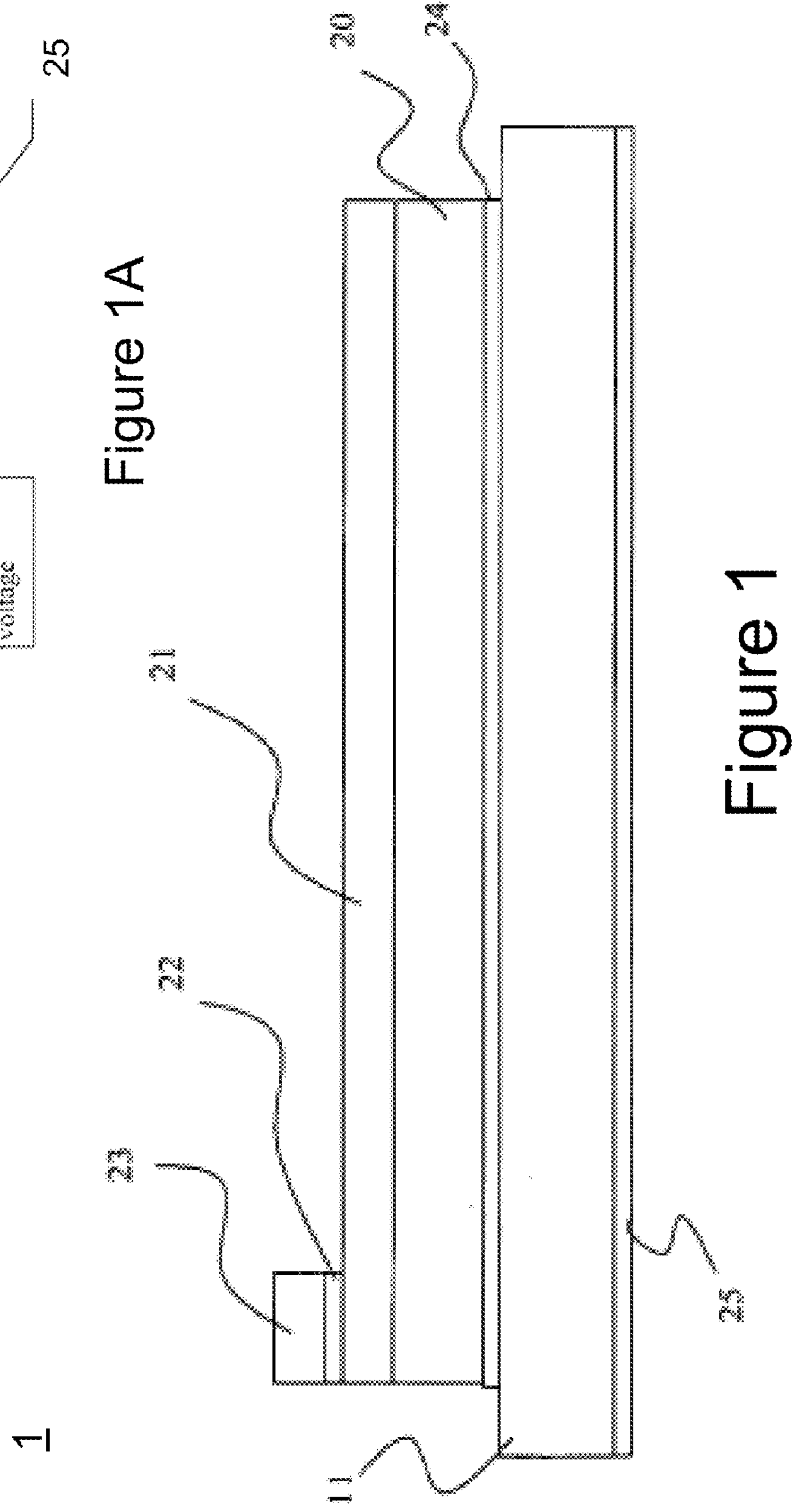

As shown schematically in FIG. 1, an electroluminescent device structure 1 comprising an emitter layer structure 20 according to an embodiment of the present invention is provided on a conductive semiconductor substrate 11, such as n doped silicon, having a back contact 25 providing a bottom electrode. An overlying top electrode comprises a transparent conducting oxide layer 21 having an electrical contact 22/23. A reflective layer 24 may be provided on the substrate 11. Light generated in the emitter layer structure 20 is emitted through the upper transparent electrode 21. As shown in subsequent FIGS. 2 to 4, the emitter layer structure 20 may comprise one or more active layers 12, each comprising rare earth luminescent centres in a host matrix, which may be electrically excited.

Figure 2:
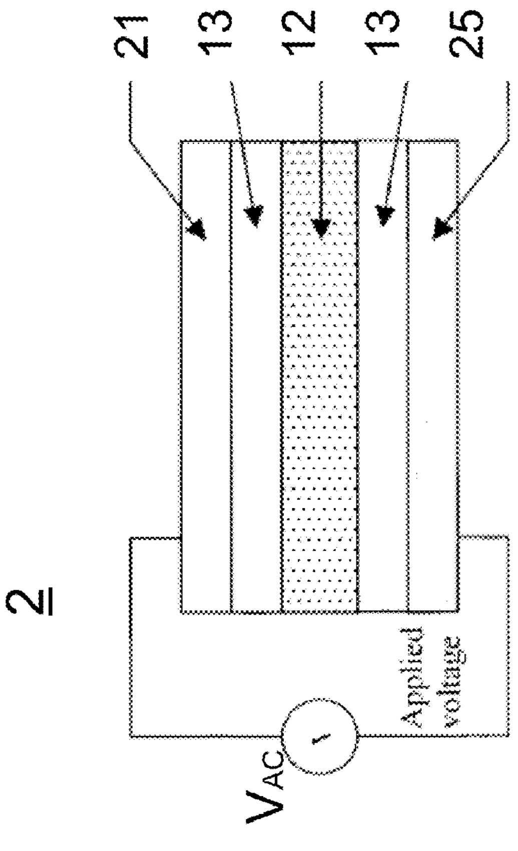
FIG. 2 shows a schematic representation of a device structure comprising an emitter layer structure according to a first embodiment of the present invention, for AC operation.
Figure 3:
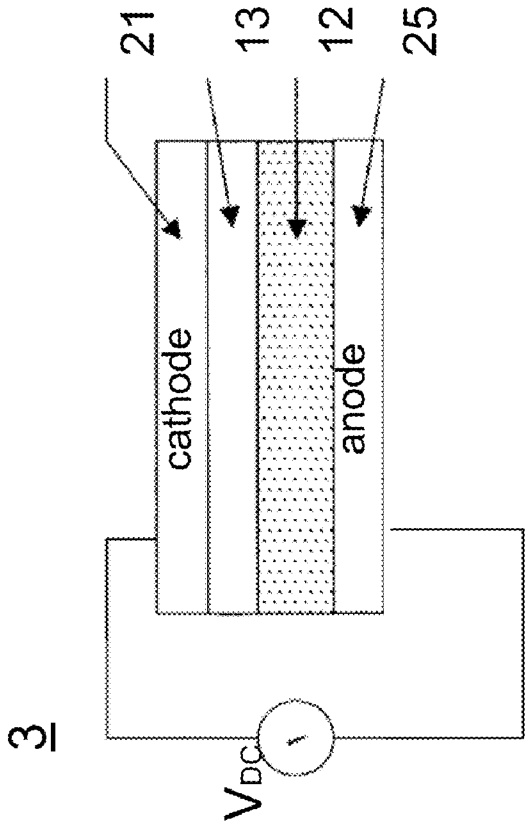
FIG. 3 shows a schematic representation of a device structure comprising an emitter layer structure according to a second embodiment of the present invention, for DC operation.

An emitter layer structure 20 according to a first embodiment of the present invention is shown in FIG. 2 and comprises an active layer 12 comprising rare earth luminescent centres in a dielectric host matrix, e.g. rare earth doped silicon dioxide, and a drift layer 13, comprising a dielectric or insulating material, e.g. silicon dioxide, disposed between the active layer and each electrode 21 and 25. At low electric fields there is no current flow and the structure acts as a capacitor. In operation, by application of an electric field larger than a characteristic threshold voltage, electrons can be injected into the active layer e.g. from an N+ substrate, or from the ITO electrode depending on the direction of bias. Injected electrons are accelerated in the dielectric drift layer 13 and an excited electron may then excite a luminescent centre in the adjacent active layer 12, e.g. by impact excitation or impact ionization. The drift layer 13 provides a region in which electrons can be accelerated, to gain excitation energy, before reaching the light emitting active layer. In the light emitting layer further energy gain is limited because of frequent collisions which result in energy transfer from sufficiently energetic electrons to rare earth luminescent centres, causing light emission, e.g. by impact excitation of rare earth luminescent centres. The structure shown schematically in FIG. 2 with two drift layers 13 is suitable for AC operation. For DC operation, where electron flow is unidirectional, i.e. from cathode to anode, an emitter layer structure comprising only one dielectric drift layer 13 would be required, i.e. next to the cathode. For example, as shown in FIG. 3, if upper TCO electrode 21 is the cathode, electrons would be injected by electrode 21 and accelerated in the drift layer 13 towards active layer 12 for excitation of luminescent centres in the active layer. The drift layer may alternatively be referred to as a buffer layer (as in the parent applications) or an acceleration layer.

Figure 4A:
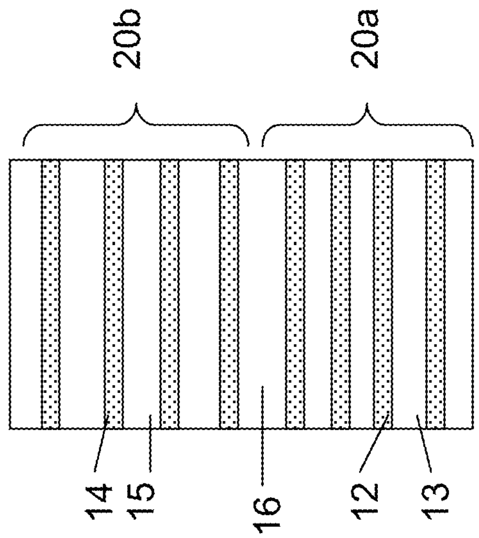
FIGS. 4A and 4B show emitter layer structures according to fourth and fifth embodiments comprising other arrangements of active layers and drift layers.
Figure 4B:
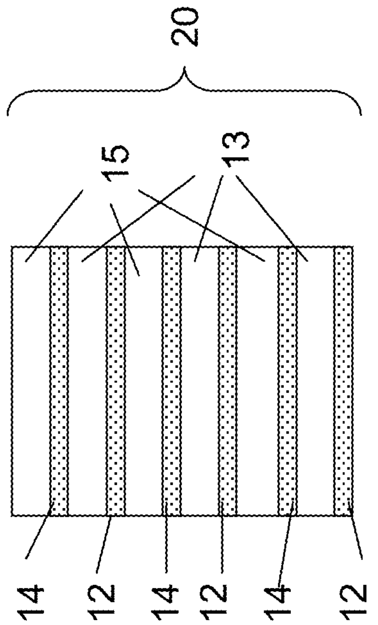
Figure 4:
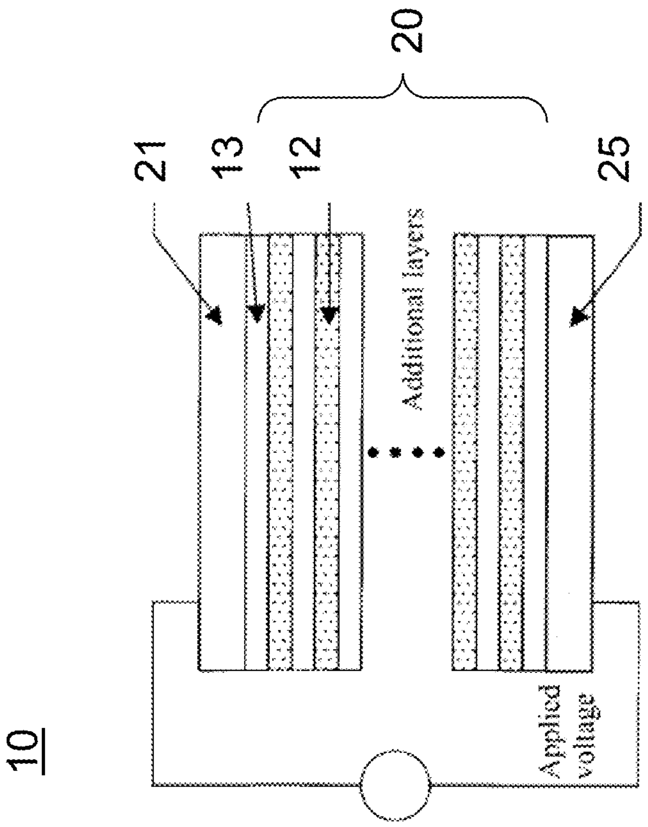
FIG. 4 shows a schematic representation of a device structure comprising an emitter layer structure comprising a plurality of active layers and corresponding drift layers according to third embodiment of the present invention.

A light emitting device structure 10 according to a preferred embodiment is shown in FIG. 4 and comprises an emitter layer structure 20 comprising multiple active layers 12 comprising rare earth luminescent centres in a host matrix, and a corresponding drift layer 13 comprising a dielectric adjacent each active layer. For example, the host matrix in each active layer comprises a dielectric such as silicon dioxide, which is doped with a rare earth luminescent species, e.g. cerium or terbium, selected to emit light at a wavelength characteristic of the particular rare earth species, and each drift layer comprises silicon dioxide. Each active layer/dielectric layer pair 12/13 functions much like the devices shown in FIG. 2 or 3, where injected electrons are accelerated in the drift layer, and an excited electron may then excite a luminescent centre in the respective active layer. However, in multilayer structures, each electron can then be accelerated again in each successive drift layer and may subsequently excite another luminescent centre in other corresponding active layers. In operation above the threshold, (typically around 4 to 5 MV/cm in a silicon dioxide based structure), a supply of electrons may be injected, allowing for higher current operation than conventional capacitative thin film electroluminescent (TFEL) devices, resulting in more electrons having sufficient energy for excitation of luminescent centres, and higher brightness. The composition and thickness of each layer can be adjusted to improve the match of electron energy to the appropriate excitation energy for emission or a photon or light of a particular wavelength from the active layers.

In the ballistic regime, the energy e in electron volts (eV) gained by an electron traversing a drift layer of thickness d (nm) in an electric field E (V/nm) is equal to the electric field multiplied by the thickness E×d. That is, to provide a particular excitation energy e the required thickness is d equal to or greater than the excitation energy e (eV) divided by the electric field E (V/nm), i.e. $E\times d \geqq e$ or $d \geqq e/E$.

The thickness of each drift layer 13 may be matched or tuned to a desired excitation energy e of the respective emissive layer 12 so that electrons gain enough energy to excite luminescent species efficiently. Thus, to provide a specific excitation energy for exciting luminescent species in an active layer, the drift layer thickness is preferably substantially equal to the required excitation energy divided by the electric field. In multilayer structures comprising a plurality of active layers, electrons may gain energy in a drift layer, transfer energy to excite luminescent centres in an adjacent active layer, gain energy from the electric field in the next drift layer, subsequently excite another luminescent centre in the next adjacent active layer, and so on.

For example for referring to the emitter layer structures shown in FIGS. 4, 4A, and 4B for an electric field E of 5 MV/cm or 0.5 V/nm, and a desired electron excitation energy of 2.3 eV (i.e. corresponding to photon energy in the green spectral region), the thickness of the buffer layer is given by the desired excitation energy e divided by the electric field E, i.e. (2.3 eV/(0.5 V/nm)=4.6 nm. For active layers 12 and 14 having different luminescent centres producing light of different wavelengths, the thickness of the drift layers 13 and 15 needed for excitation of each respective active layer would be determined accordingly, and may be different for each active layer emitting at light of a different colour or wavelength and requiring excitation at a different excitation energy.

Careful consideration and design of the drift layer thickness in conjunction with the operating electric field allows tuning of the electron energy with the drift layer thickness for structures comprising one or many active layers, and a drift layer of the appropriate thickness adjacent each active layer. The drift layers comprise a wide bandgap semiconductor or dielectric material, such as high quality oxides or nitrides of silicon. Since the device operates at relative high electric fields, typically ~4-8 MV/cm (i.e. above a minimum threshold voltage for current injection, and below an upper limit depending on the breakdown field of specific materials) high quality dielectric or wide bandgap semiconductor layers are required, with low trap density. For example, undoped silicon dioxide is for drift layers and is a suitable host matrix for the active layer when doped with rare earth luminescent centres. The structure may be deposited by techniques such as CVD (chemical vapour deposition), PECVD (plasma enhanced CVD), sputtering, ALE (atomic layer epitaxy) and MBE (molecular beam epitaxy), capable of depositing high quality layers of ~1 nm to ~10 nm thickness.

A light emitting structure for a single colour may be provided by an engineered film structure comprising a layer stack repeating identical pairs of active layers and dielectric drift layers 12/13 e.g. multi-layer structure 20 with identical active layers 12 as shown in FIG. 4. Mixed colors, e.g. white, can be emitted by a structure comprising active layers emitting two or more colours or wavelengths, e.g. several layer pairs for each constituent colour. Thus the emitter layer structure may comprise one or more layer pairs 12/13 comprising a first active layer emitting a first wavelength or color, and one or more layer pairs 14/15 comprising a second active layer emitting a second wavelength or color, as shown schematically in FIG. 4A where first and second active layers are grouped as separate stacks, or as shown in FIG. 4B where first and second active layers 12, 14 are interleaved with respective first and second drift layers 13, 14. For engineered film structures such as shown in FIGS. 4A and 4B to be powered by AC electrical power, in which neighboring active layers 12 and 14 emit at different wavelengths, and require different excitation energies, the intervening drift layer 13 or 15 (i.e. layer 16 in FIG. 4A) must be thick enough to excite the luminescent centres in active layer 12 or 14 requiring the higher excitation energy. In other embodiments, it will be appreciated that a layer stack comprising a plurality of active layer and drift layer pairs may comprise other arrangements of one or more active layers emitting at a first wavelength, and one or more active layers emitting at other wavelengths. Corresponding drift layers adjacent each active layer may be configured for AC and/or DC operation as appropriate.

Since the electron energy for exciting the rare earth luminescent centres is determined by the distance traveled in the applied electric field, which is the thickness of the corresponding drift layer, combined with the distance traveled within the active layer, to minimize the spread of energies and optimize energy transfer, the active layers comprising rare earth luminescent species are preferably relatively thin. On the other hand, a thicker active layer provides more luminescent centres, and optimally there is a trade off between thicker active layers providing more luminescent centres for a given rare earth concentration vs. more precise energy matching for thinner active layers.

Thus, as taught in the copending (parent) U.S. patent applications, the thickness of active layers without nano-particles, e.g. rare earth oxide layers or rare earth luminescent centres in silicon dioxide or silicon nitride, is typically determined empirically based on a trade-off between the energy requirements and the brightness of the light. On the one hand, if the active layer is infinitely thin then the excitation energy would be precisely known for the whole layer and therefore energy matching could be optimized by appropriate selection of the thickness of the drift layer; however, if the active layer is infinitely thin, there would be no luminescent centers and no light. The thicker the active layer is, the brighter the layer can be, since there would be more luminescent centers per sq mm; however, energy matching will not be optimum throughout the entire thickness so there will be a loss of efficiency.

The concentration of rare earth dopant in the active layer is ideally determined such that the electron capture cross section (σ)×the areal density=thickness of the active layer, and the concentration is ideally is as high as possible, while avoiding clustering effects which may lead to quenching of light emission. Typically suitable concentrations of rare earths in the active layers will be less than 1% up to 5%.

Clustering and quenching relaxation effects limit the concentration of preferred rare earth species in silicon dioxide and silicon nitride, e.g. erbium, terbium and cerium, for providing red, green and blue light respectively. However, in some embodiments disclosed herein, alternative host matrix materials, such as alumina or aluminum doped dielectrics, may allow for incorporation of higher concentrations of rare earth luminescent centres.

Figure 5A:
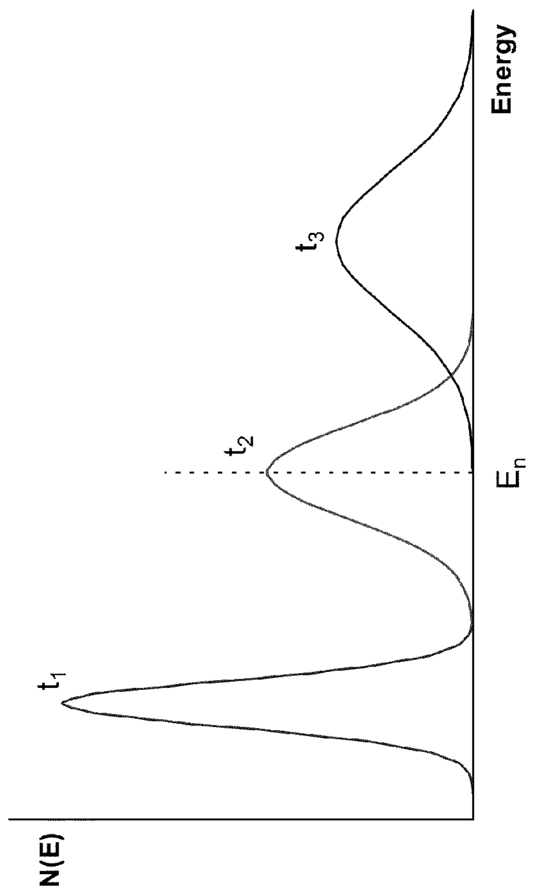
FIG. 5A shows schematically the electron energy distribution for electrons traversing a drift layer of thickness $t_1$, $t_2$ or $t_3$.
Figure 5B:
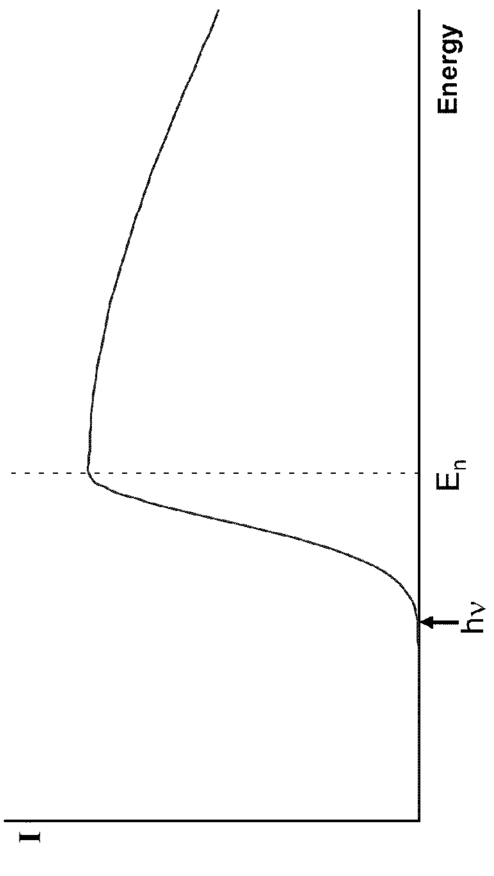
FIG. 5B shows a representation of an excitation energy spectrum, i.e. capture cross section $\sigma$ vs. electron energy E for a rare earth doped oxide layer.

FIG. 5A shows schematically the electron energy distribution N(E) for electrons traversing a drift layer of thickness $t_1$, $t_2$ or $t_3$ (nm), in an electric field E V/nm and FIG. 5B shows a representation of an excitation energy spectrum, i.e. capture cross section a as a function of electron energy E for a rare earth doped oxide layer. As shown schematically in FIG. 5A, the energy gained by electrons traversing the drift layer in the electric field is not a delta function, but has a distribution of energies around a peak energy, dependent on the thickness of the drift layer. Thicker drift layers will create an excitation energy spectrum or band having a higher energy peak, but also tend to provide a broader distribution of energies. The excitation spectrum for emission of a particular wavelength from an active layer comprising a rare earth luminescent species in a dielectric host matrix typically has a form such as shown in FIG. 5B, and light emission typically requires an energy somewhat higher that the photon energy hυ of a particular emission wavelength. Such an excitation spectrum may be determined from a test structure with layers of a particular thickness by tuning the excitation voltage of the applied field, or test structures with different drift layer thicknesses. Thus for improved emission efficiency of the electron energy distribution is matched to the excitation spectrum of the active layer for emission at a particular wavelength, by providing a drift layer of the appropriate thickness so that electrons traversing the buffer layer in the applied electric field (which depends on the operating voltage of the device and number of layers) provide the required excitation energy. Ideally, as shown schematically in FIGS. 5A and 5B for optimal efficiency, the peak of the electron energy distribution is matched closely to the energy $E_n$ corresponding to the peak of the excitation spectrum, by providing a drift layer of an appropriate thickness. Typically, when a minimum excitation energy is provided above a threshold for emission, for a given rare earth doped layer, the emission spectrum of a particular rare earth doped layer is not dependent on excitation energy over the energy range tested (e.g. 2.5 eV to 5 eV for terbium), however appropriate energy matching of the excitation energy optimises the excitation efficiency and brightness of emission, i.e. luminous efficacy.

Figure 6:
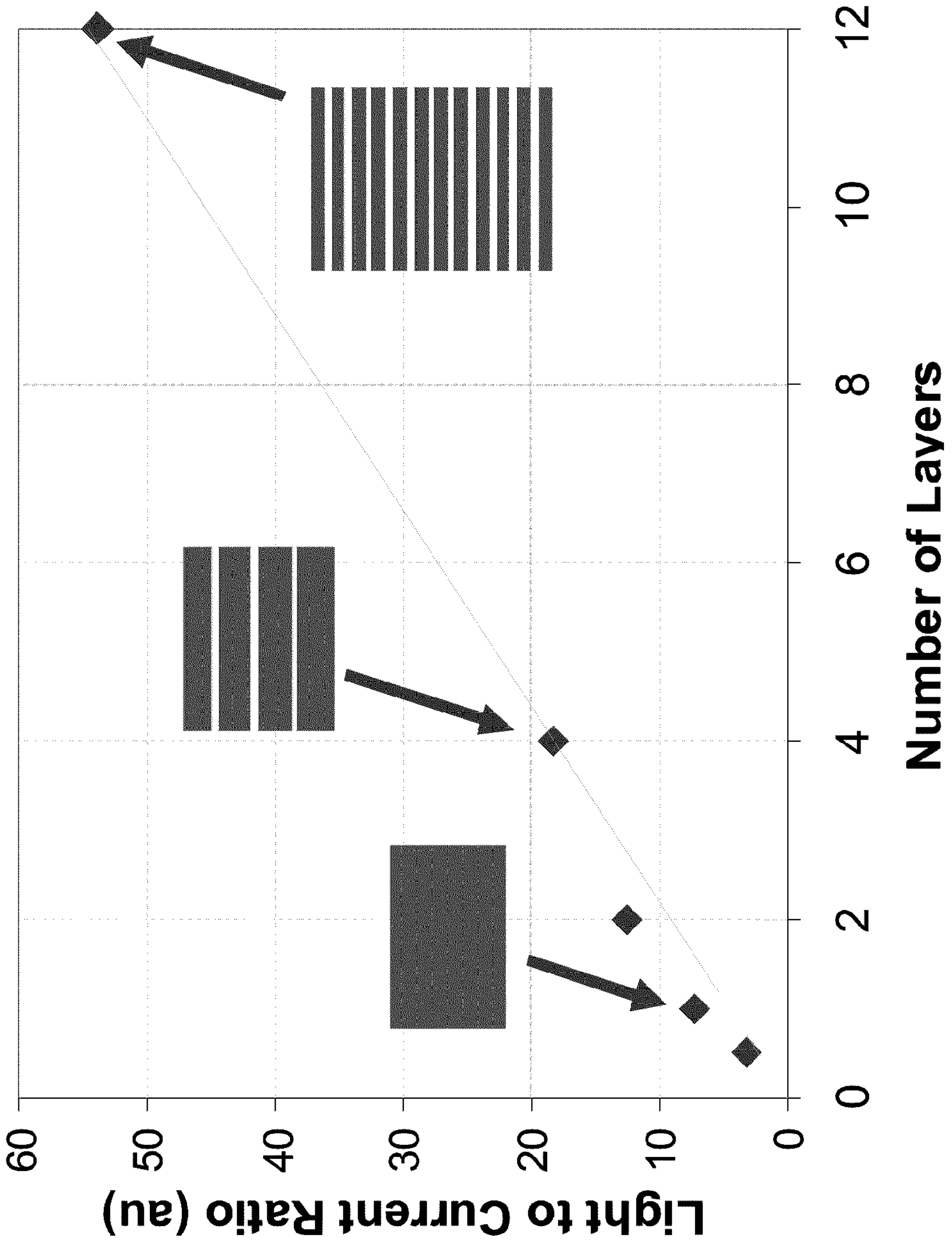
FIG. 6 shows experimental results comparing light emission from a light emitting device comprising a single 60 nm thick active layer of rare earth doped silicon oxide with light emission from light emitting devices according to embodiments of the invention comprising multiple thinner active layers of the same combined thickness, separated by drift layers of an appropriate thickness for excitation of luminescent centres in the active layers.
Figure 7:
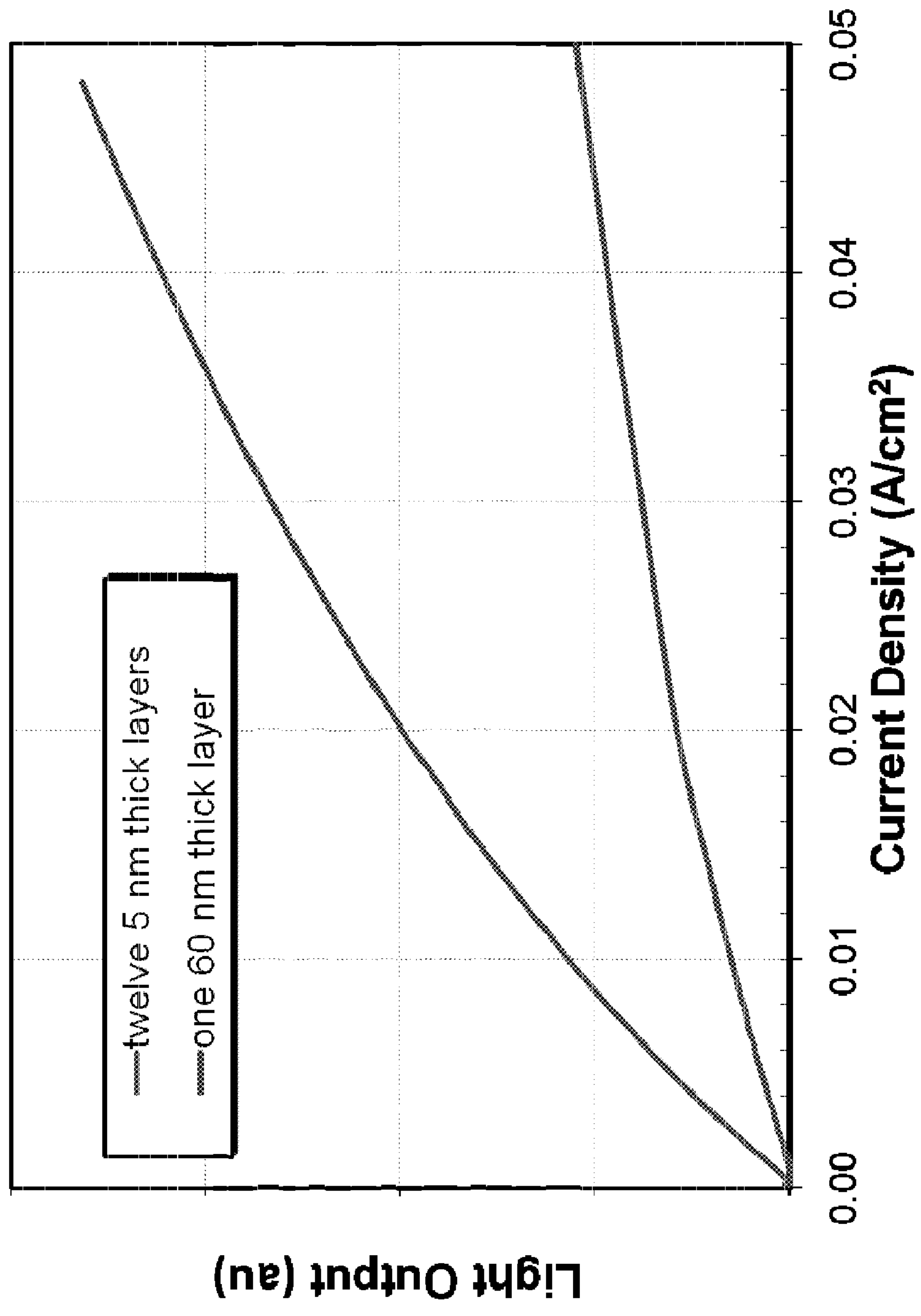
FIG. 7 shows the light emission as a function of current density for device structures comprising a) one 60 nm thick rare earth doped active layer, b) and twelve 5 nm thick rare earth doped active layers separated by drift layers of an appropriate thickness.

By way of example, some results of an experiment are shown in FIGS. 6 and 7, which compare the light emission from a device comprising a single layer (60 nm thick) of rare earth doped silicon dioxide with emission from devices having up to 12 thinner layers (5 nm thick) of rare earth doped silicon dioxide separated by drift layers of silicon dioxide of an appropriate thickness. The total thickness of rare earth doped silicon dioxide remained the same, and the same current was applied to each device, all of the same area. As the number of active layers increased, i.e. up to 12 thinner layers of ~5 nm doped silicon dioxide, the flux (total light output) and efficiency increased almost linearly.

Similar results were obtained with devices comprising cerium, terbium or europium doped silicon dioxide active layers. In the multilayer structure, when the thickness of the undoped drift layers within which the electrons accelerate is adjusted so that the electrons are accelerated in the electric field as they traverse the drift layer so as have enough energy to excite the rare earths in the respective neighbouring doped layer, the process recurs in each undoped/doped layer pair. Thus, by selecting an appropriate thickness of the respective drift layer for each active layer/drift layer pair, electrons are provided with sufficient energy for excitation of rare earth species in each respective active layer, and electron energy is less likely to be wasted because there is too little (not enough to excite a rare earth from a collision), or too much (excess energy is wasted). The efficiency does not rise quite as quickly, because the interposed undoped drift layers increase the overall thickness of the multilayer structure, and there is some increase in voltage is required to sustain the same current in more layers.

Figure 8:
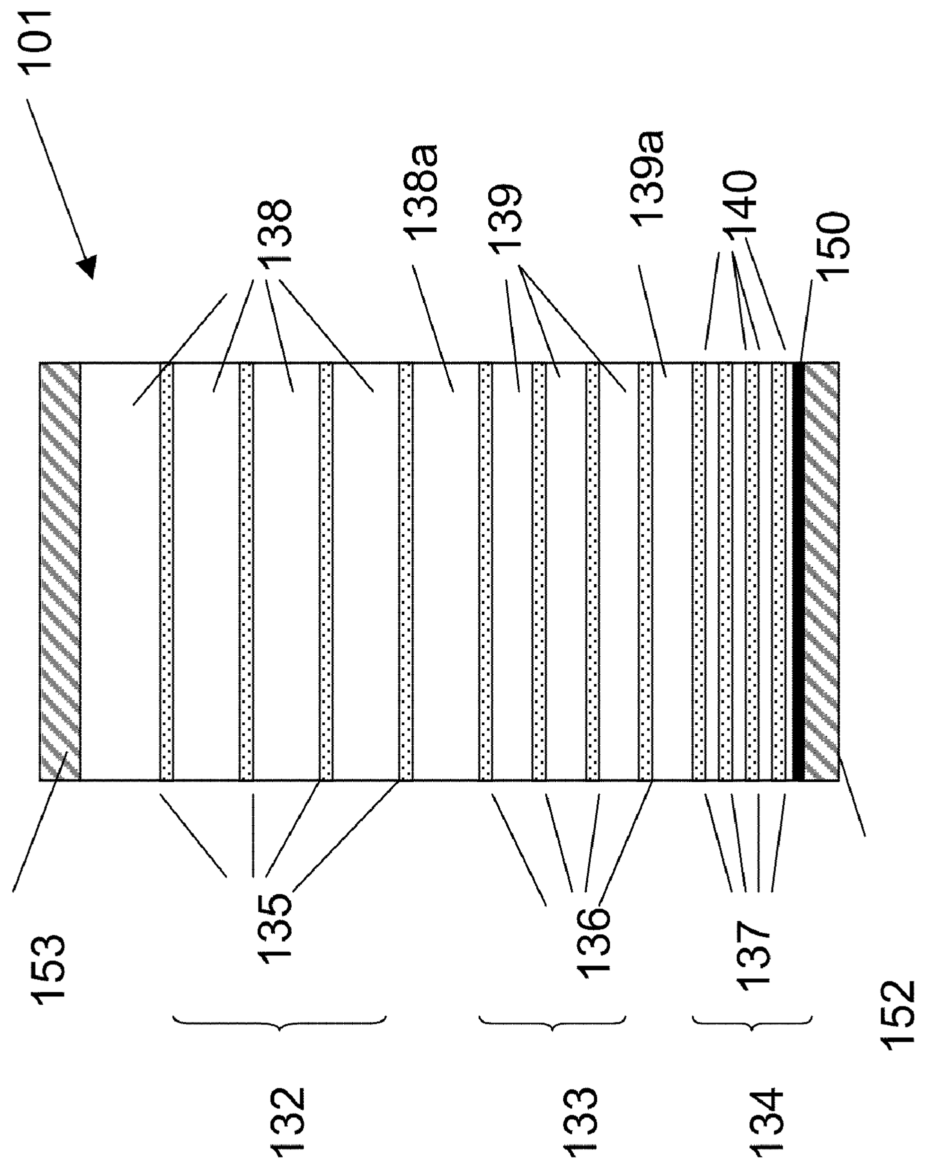
FIG. 8 shows an emitter layer structure according to a sixth embodiment of the present invention for DC operation.
Figure 9:
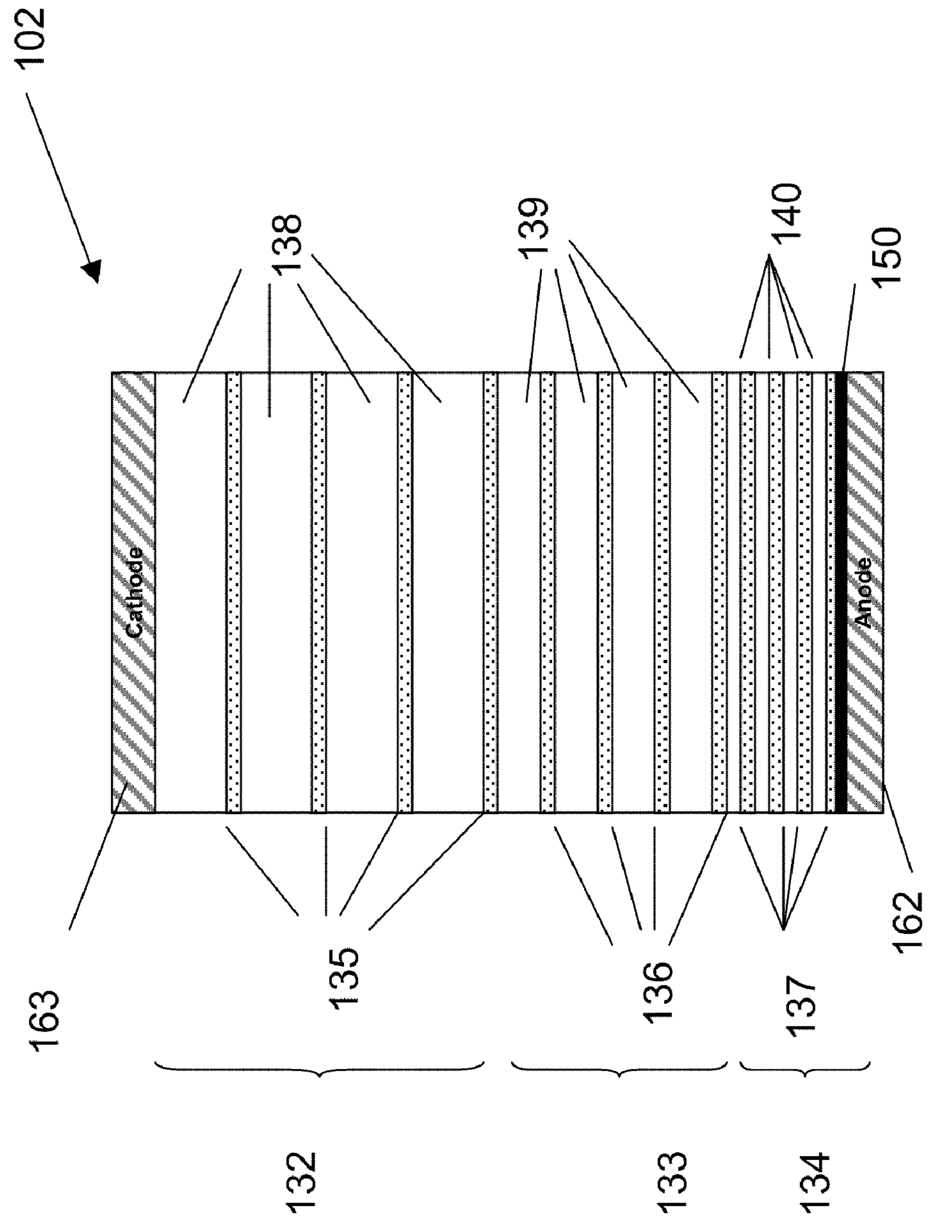
FIG. 9 shows an emitter layer structure according to a seventh embodiment of the invention for AC operation.

Emitter layers structures according to other preferred embodiments, as shown in FIGS. 8 and 9, comprise a plurality of stacks 132, 133, 134, each emitting a different wavelength, i.e. respectively blue, green and red wavelengths, which are combined to provide white light of a desired colour rendering index.

Referring to FIG. 8, the emitter layer structure comprises a multilayer stack 101 wherein each layer stack 132, 133, 135 comprises respectively a plurality of active layers 135, 136 and 137, each comprising rare earth luminescent centres in a dielectric host matrix for light emission at an appropriate wavelength. Corresponding buffer layers 138, 139 and 140 comprise an appropriate dielectric of the appropriate thickness to provide the required excitation energy for efficient excitation of an adjacent active layer. A reflective layer or coating 150 is provided between one of the electrodes, i.e. bottom electrode 153 and the stack of layers 135, 136 and 137 to reflect emitted light back through a transparent top electrode 152. This arrangement is suitable for AC operation, having drift layers at the top and bottom of the stack, as described with reference to FIG. 4. Thus the thickness of drift layers 138*a* and 139*a* between active layer stacks emitting different wavelength is sufficient to enable efficient excitation of the respective adjacent active layer having the higher excitation energy.

FIG. 9 shows a corresponding emitter layer structure 102 suitable for DC operation, with the emitter layer stack disposed between anode 162 and cathode 163, and with drift layers arranged for operation when biased for electron flow from the cathode to the anode. The active layers 135, 136 and 137 and most of the drift layers 138, 139 and 140 are identical to those in the engineered film structure 101; however, since the electrons only travel in one direction, the intervening drift layers between different types of active layers must be the correct thickness to excite the nano-particles in the nanoparticle active layer closer to the anode 162. Accordingly, the engineered film structure 102 is preferably terminated by one of the first drift layers 138 at the cathode 63 and by a nanoparticle layer 137 at the anode 62. Moreover, since the electrodes travel only in one direction, i.e. from the cathode to the anode, one of the second buffer layers 139 is between the first stack 132 and the second stack 133, and one of the third buffer layers 140 is between the second stack 133 and the third stack 134.

Figure 10:
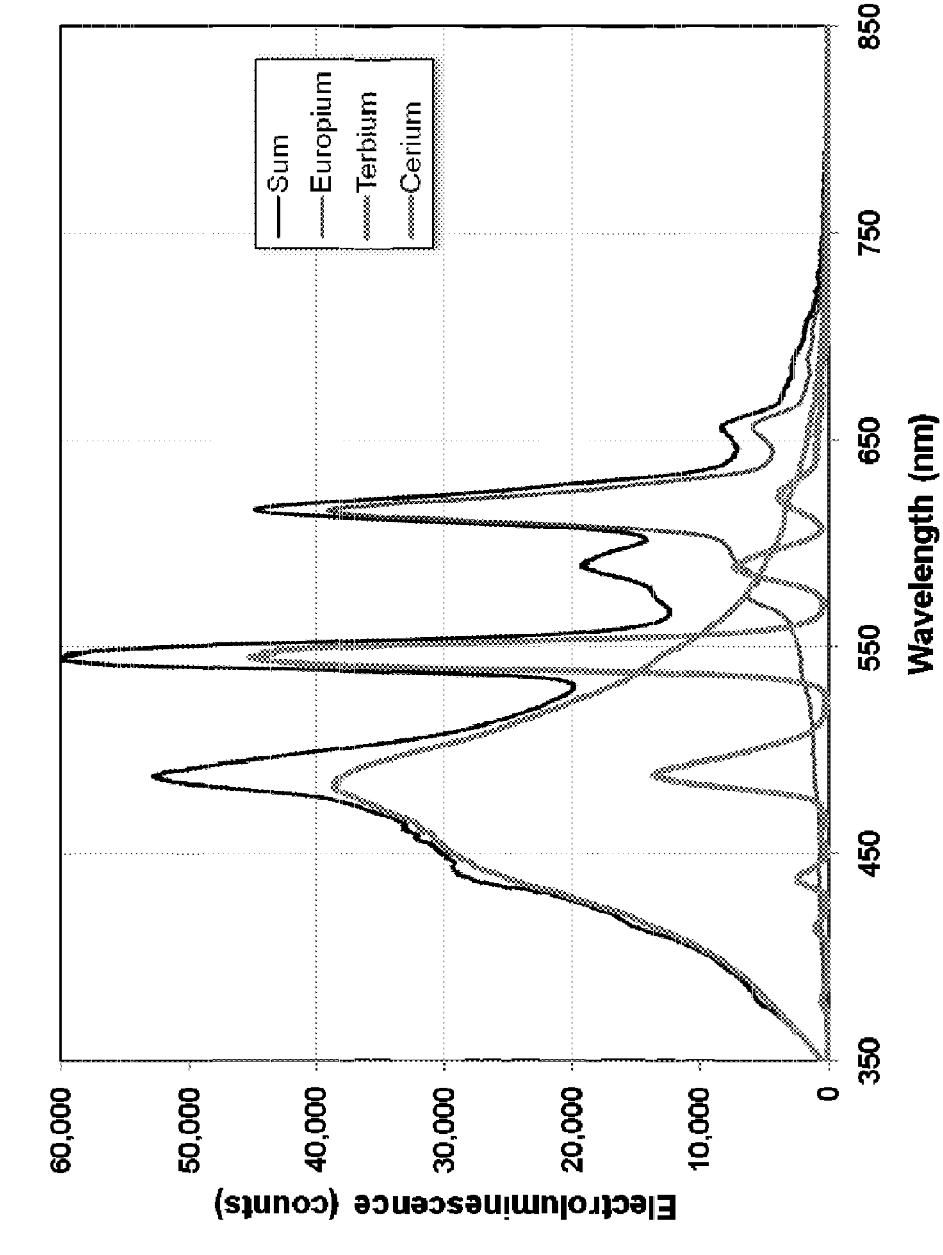
FIG. 10 shows an example of luminescence spectra from three individually doped samples (one doped with Ce, one with Tb, and one with Eu) shown on the same plot.

In a preferred embodiment, the active layers 135, 136, 137 respectively, in each of 3 layer stacks 132, 133, and 134, comprise a host matrix which is provided by high quality, stoichiometric silicon dioxide with up to 5 at % of rare earth luminescent centre and each of the drift layers comprise silicon dioxide of an appropriate thickness as described above. Preferably, each of the three sets of active layers 135, 136 and 137 comprise silicon dioxide doped with rare earths to provide luminescent centres in each group of active layers selected to emit light at a desired wavelength or wavelength range, $\lambda_1$, $\lambda_2$, $\lambda_3$, e.g. using cerium, terbium and europium respectively for blue, green and red emitting layers 135, 136 and 137, so that the combined emission from the multilayer stack provides white light of a desired color (CRI). N pairs of active/dielectric layers altogether may comprise k pairs for blue 135/138, m pairs for green 136/139, and n pairs for amber/red/orange 137/140, where k+m+n=N. The number of each of the colour pairs, e.g. 135/138, 136/139 and 137/140, as shown in FIGS. 8 and 9, can be varied so that a desired color rendering index (CRI) can be achieved. For example, a warm white requires more pairs of red than blue, while a cool white requires the opposite. By adjusting the ratios of the three spectra by varying the number of active layers of each colour, an excellent CRI of 91 (relative to the $D_{65}$ solar spectrum) may be obtained from the sum of the three spectra (FIG. 10).

As explained above, each active layer is relatively thin, i.e. ~1 nm to 10 nm~thick. For example for active layers comprising silicon dioxide doped with cerium or terbium, the active layers may be 4 nm thick. Each drift layer has a specific thickness, relative to the applied electric field, which is dependent on a respective excitation energy required to excite luminescent centres in an adjacent active layer. Preferably each drift layer has a thickness substantially equal to the excitation energy divided by the electric field. That is, as represented schematically (not to scale) in FIGS. 8 and 9, the thicknesses of the drift layers 138, 139, 140 relative to the electric field for each of three layer stacks 132, 133, 134 are preferably substantially in proportion to the respective excitation energies required for excitation of adjacent active layers.

Other preferred materials for the active layers may comprise rare earth luminescent centres in a host matrix comprising a rare earth oxide or halogenide, or rare earth doped dielectrics comprising silicon dioxide, silicon nitride or silicon oxynitride. Silicon dioxide or silicon nitride may be used for the corresponding drift layers, although silicon dioxide is preferred.

For applications requiring high brightness, e.g. solid state lighting, this type of light emitting device structure offer many advantages in terms of efficiency, brightness, colour control and lifetime compared with a conventional thin film electroluminescent device (TFEL). Furthermore, these structures may be fabricated using materials based on and compatible with silicon or other Group IV semiconductors.

Consequently, since rare earth doped dielectrics such as silicon dioxide and silicon nitride of high quality can be deposited reliably and consistently, these materials offer several advantages to provide engineered multilayer emitter layers structures comprising relatively thin active layers and respective drift layers having thicknesses matched to an excitation energy of an adjacent active layer.

Rare earth luminescent species typically have a characteristic emission spectrum, which may be a narrow band or broader band over a range of wavelength characteristic of the rare earth species. For example, cerium has a relative broad emission spectrum, while some other rare earth species provide relatively narrow emission bands, and multiple layers with different rare earths may be required to obtain a desired CRI. That is, if one or more rare earth species emit strongly over a relatively narrow wavelength range or ranges, when combined they may provide white light, but this spectrum is made up of several narrow lines or bands, not a continuous broad spectrum (cf. incandescent light sources). For structures with a limited number of layers and rare earth dopants, adding or removing a layer emitting a particular colour may alter the spectrum too much or too little to obtain the right balance of colours.

While the emission spectrum of some rare earth ions is relatively independent of the host matrix material, the emission wavelength or spectrum of some rare earth species, notably cerium, may be influenced to some degree by interactions with a dielectric host matrix material. Typically, rare earth species with narrow emission bands have emission spectra which are substantially independent of the host matrix. The emission spectrum of rare earth species having broader emission bands, such as cerium ($Ce^{3+}$) and europium ($Eu^{2+}$), may be shifted in different matrix materials. Appropriate selection of the host matrix material may be used to tune the emission spectrum of a particular luminescent rare earth species, e.g. to shift emission to a the visible region, provide more continuous spectrum covering a range of wavelengths, or improved control of the colour or CRI.

Thus, in other preferred embodiments described herein (see Examples described below), the light emitting material of each active layer preferably comprises rare earth luminescent centres in a suitable dielectric or widebandgap host matrix material for emitting light of a particular colour or wavelength, characteristic of the particular rare earth luminescent centres and host matrix material. Active layers may for example comprise a rare earth oxide layer or a layer comprising rare earth dopants in dielectric host matrix comprising for example silicon dioxide, silicon nitride or silicon oxynitride. In some embodiments, other suitable dielectric host matrix materials comprise aluminum oxide, and other aluminum containing dielectrics such as aluminum doped silicon dioxide, or SiAlON. As described above, the drift layer preferably comprises silicon dioxide or other high quality dielectric. In structures comprising these materials, electrons are accelerated by the applied electric field, and when they collide with the luminescent centres and transfer their energy, i.e. by impact excitation, to excite the rare earth luminescent centres to emit light at a wavelength characteristic of the particular rare earth species. Typically rare earth luminescent species comprise trivalent ions, e.g. as found in rare earth oxides or halogenides, e.g. fluorides. Appropriate matching of the electron excitation energy by providing a drift layer thickness specific to the excitation energy of luminescent species in an adjacent active layer provides for improved excitation efficiency and luminous efficacy.

By use of these structures and materials, effective excitation of active layers may be achieved by appropriate selection of the thickness of each respective drift layers, as described above, to better match excited electron energies to the required excitation energy of luminescent centres in adjacent active layers. Excellent brightness and luminous efficacy may thus be achieved in such multilayer structures with rare earth doped dielectric active layers. High luminous efficacy is obtained without requiring nanocrystals or nanoparticles to act as sensitizers.

Figure 12:
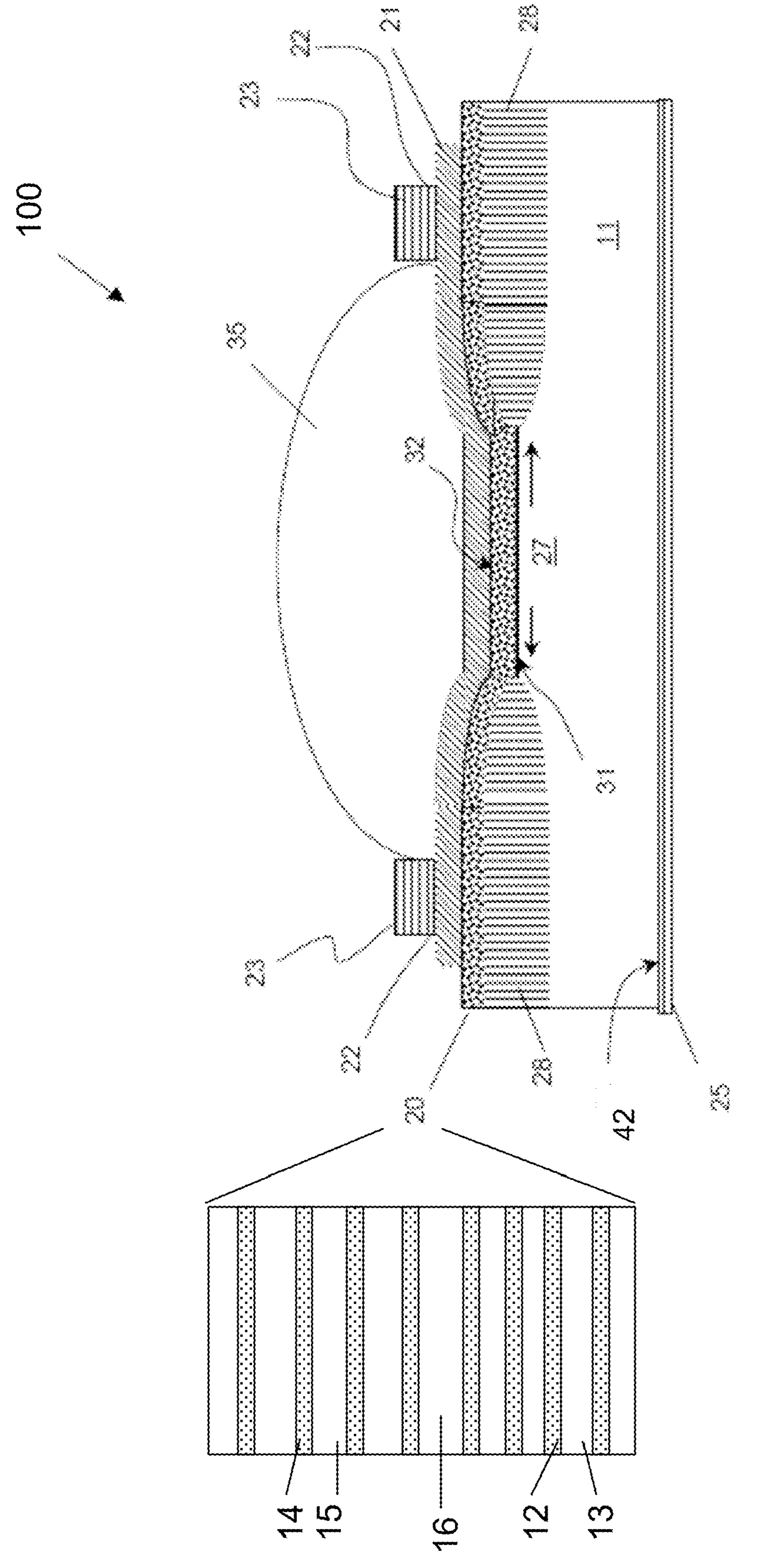
FIG. 12 shows a schematic representation of an embodiment of an electroluminescent device structure embodying an emitter layer structure similar to that shown in FIG. 4A.
Figure 13:
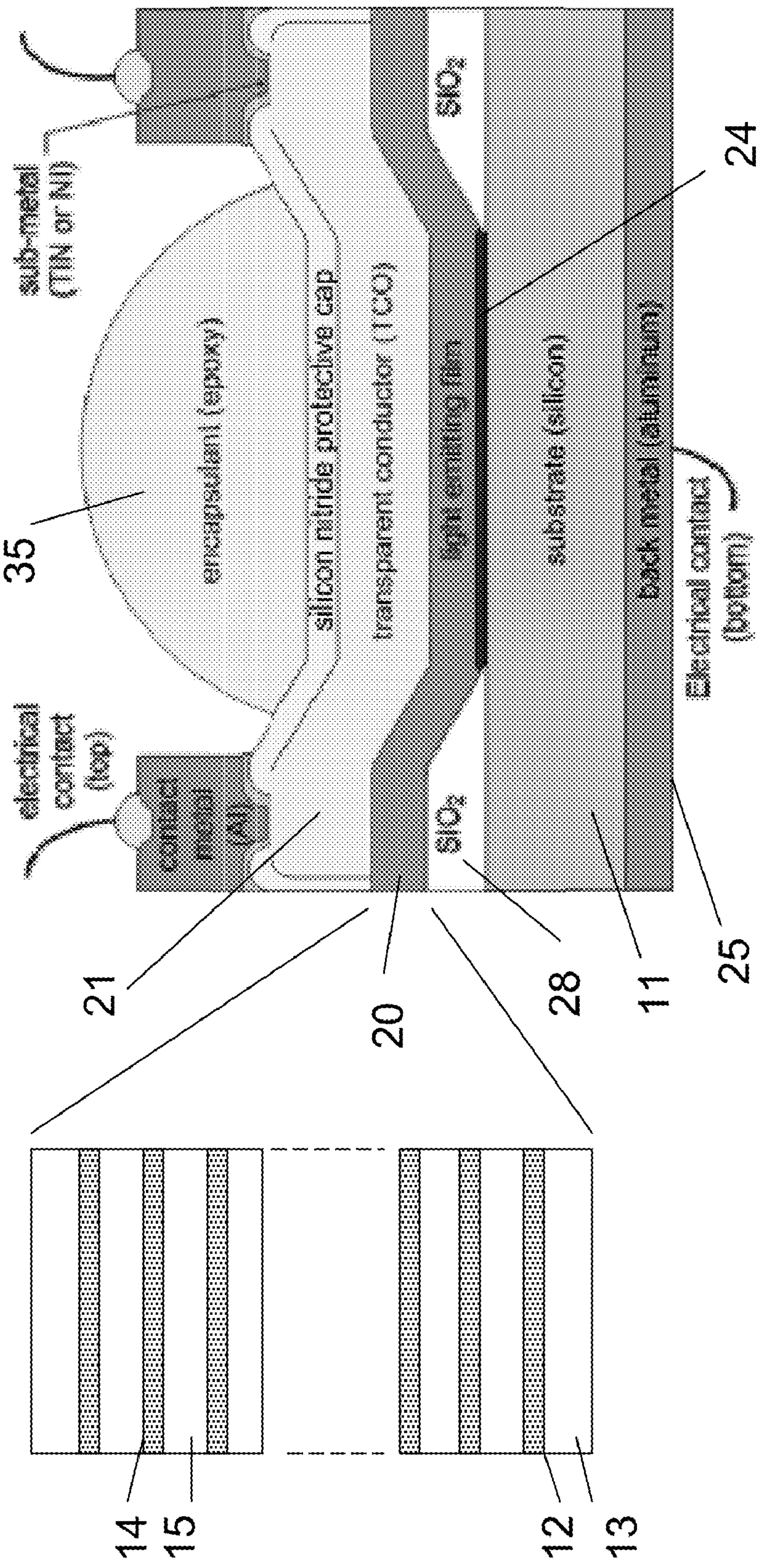
FIG. 13 shows a schematic representation of another embodiment of an electroluminescent device structure embodying an emitter layer structure similar to that shown in FIG. 4A.

As noted above, for electroluminescent devices that work under relatively high electric fields (~5 MV/cm) high quality dielectrics, e.g. with low trap density, are required to obtain sufficient device lifetime. Furthermore, for operation at high fields, it is desirable to provide contact structures that reduce discontinuities, avoid localised high field regions, that may lead to propagation breakdown, and better control current injection in active regions, e.g. for improved performance and device lifetime. Thus, as described in copending U.S. patent application publication Ser. No. 20080246046 entitled "Pixel Structure for a light emitting device", in fabrication of large area emitter structures, the active region may be divided into a device well regions. For example, as shown in FIG. 12, a device structure is shown comprising a device well 27 which may be defined on the substrate 11, by providing field oxide regions 28, i.e. by a LOCOS type process as represented by the device structure in FIG. 12, or by deposition and patterning of a field oxide layer 28 for example as shown in FIG. 13. Subsequently, a multilayer light emitting structure 20 comprising one or more layer pairs of active layers and respective drift layers, e.g. similar to FIG. 4A, are deposited thereon. This device well structure is advantageous because electrical contacts 23 may be placed over the field oxide 28, and current injection (and thus light emission) is thereby confined to device well regions 27 between the field oxide regions. The structure helps to reduce high field regions at edges of the active region. A pixellated device structure may also be provided comprising a plurality of small device well regions or pixels. By dividing the area in to device well regions or pixels, higher efficiency may be achieved, and deleterious effects such as propagating breakdown are also reduced.

In multilayer emitter structures 20 when electrons are gain energy from the electric field as they pass through a drift layer, a percentage of electrons will interact with luminescent centres and cause light emission, but other electrons will miss optical centres in this layer 12 and therefore lose very little energy, and as they enter a second drift layer 13, they will continue to gain additional energy from the electric field. One drawback of a multi-layered structure of this type is that any electrons that do not excite luminescent species may be accelerated in successive layers and gain significant energy. Such hot electrons may cause deleterious effects or premature breakdown. In theory, one way to reduce the probability of hot electrons passing unobstructed through the emissive layer is to ensure the density of optical centres is high enough that the electron capture cross section of the luminescent centres in the active layer makes the layer effectively opaque to incident electrons. The electron capture cross section depends on the particular optical/emissive centre(s) used, and thus the required density, or concentration, of optical centres is dependent on the species and its capture cross section. However, as mentioned above, clustering and cross relaxation effects limit the concentration of preferred rare earth species in silicon dioxide and silicon nitride, e.g. erbium, terbium and cerium, for providing red, green and blue light respectively.

Since it is desirable that electron energy is maintained below the threshold for damage, while being sufficient for efficient light emission at the desired wavelength, optionally, a stopper layer structure 40 is provided between the emitter structure 20, and the TCO electrode 21, or within the emitter layer structure, as described in U.S. patent publication Ser. No. 20090128029 filed Nov. 19, 2008 entitled "A Light Emitting Device With a Stopper Layer Structure".

As shown in FIGS. 12 and 13 an encapsulant 35 may be provided having a refractive index closely matched to the refractive index of the underlying device structure. The encapsulant 35 reduces total internal reflections at the emitter layer structure/encapsulant interface and improves the light extraction efficiency of the device 100. The encapsulant layer 35 preferably has a domed or curved upper surface to provide a lensing function. A back reflector 42 may also be provided between the substrate 11 and the emitter structure 20 or between the substrate 11 and a bottom contact 25 (layer 24) to reflect light generated within the emitter structure 20 back through the transparent upper electrode 21.

The drift layers in the emitter stack may be configured for AC or DC operation, i.e. if the device is configured for AC operation, typically the top and bottom layers of the emitter layer stack 20 will be drift layers 13 adjacent each electrode. For DC operation, drift layers are required only on the cathode side of each active layer.

Preferred embodiments of the light emitting structure may be configured with an appropriate arrangement of at least one active layer and drift layer pair for DC or AC operation. Devices may be configured with electrodes for electrically powering the device by suitable AC or DC voltages, which may be standards mains voltages (110 VAC or 220 VAC).

The latter structure provides many advantages in terms of efficiency, brightness, colour control and lifetime compared with a conventional TFEL (Thin Film Electroluminescent Device). A conventional TFEL is effectively a capacitative device driven by application of an AC voltage. That is, an emissive layer is sandwiched between two electrodes, with a dielectric layer isolates the active layer from each electrodes. It is dependant on using available stored charge, which is excited or energised by the changing the electric field, to excite luminescent centres, e.g. by impact excitation, and typically operates at lower voltage and comprises a thicker layer of active material.

Thus, embodiments of a multilayer engineered structure as described above provides for improved control, i.e. matching or tuning of, the electron energy to the excitation energy of an active layer by appropriate selection of the thickness of the respective drift layer, for a particular electric field, to the required excitation energy of luminescent species in the active layer to provide more efficient excitation of luminescent species, resulting in higher brightness, and luminous efficacy. An engineered structure using the materials described above have led to significant improvements in luminous efficacy (lm/W) or luminance (cd/m$^2$) relative to previously known device structures based on materials containing luminescent centres comprising rare earth doped materials and/or silicon nano-crystal or nano-particles.

Solid state light emitters according to other preferred embodiments of the present invention comprise one or more active layers, each comprising rare earth luminescent species in a dielectric host matrix material. Preferred materials systems are disclosed, particularly those based on aluminum oxide, aluminum doped silicon dioxide, silicon oxynitrides with and without aluminum doping, and more generally dielectrics of the structure $Si_aAl_bO_cN_d$, in which silicon, aluminum, oxygen and nitrogen may be present in varying ratios. That is, host matrix materials which are binary, ternary or quaternary compositions of silicon, aluminum, oxygen and nitrogen. These materials may provide one or more advantages, with respect to efficiency, performance and/or spectrum control.

Examples will be described with reference to the electroluminescent device structures shown in FIGS. 1 to 4 described above, for the following dielectric materials:

Stoichiometric or non-stoichiometric, crystalline or amorphous aluminum oxide or alumina;
Aluminum doped silicon dioxide;
Silicon oxynitrides
Silicon oxynitrides, with aluminum doping.

In exemplary embodiments of the emitter structure to be described below, the active layers 12 or 14 may comprise rare earth (RE) doped silicon dioxide, alumina, silicon nitride, silicon oxynitride, SiAlON or other dielectric material of general formula $Si_aAl_bO_cN_d$, which may be denoted as RE:$Si_aAl_bO_cN_d$. Corresponding drift layers 13 or 15 may comprise an appropriate thickness of a similar dielectric material compatible with host matrix material of the active layers, and preferably the thickness of each drift layer being matched to the required excitation energy of the respective active layer, as described above.

The rare earth doped host matrix material of the active layer, and corresponding drift layer must be of high quality, with low trap density, and have a sufficiently high breakdown voltage for operation at fields of ~4 MV/cm to 10 MV/cm, depending on available voltage. As described above, silicon dioxide is an excellent choice for both the active layer host matrix and the drift layers and provides advantages over silicon nitride, which tends to have a higher trap density. However, other materials systems offer advantages for some applications as will now be described.

The respective drift layer associated with each active layer is provided of a dielectric material compatible with the host matrix material of the active layer. Generally, high quality silicon dioxide ($SiO_2$) is preferred for drift layers, although stoichiometric aluminum oxide ($Al_2O_3$), aluminum doped silicon dioxide, silicon doped aluminum oxide, or other oxides of general formula $Si_aAl_bO_c$ may be selected to be compatible with the host matrix material of the adjacent active layer. For example if active layers comprise rare earth doped aluminum oxide, the latter may also be used undoped as the drift layers. Silicon dioxide may be preferred as a drift layer for use with a host material comprising aluminum doped silicon dioxide. Silicon nitride may be used, for the drift layer, if of sufficiently high quality, but generally silicon nitride and other nitrogen containing oxides tend to be inherently more "trappy", i.e. have a higher trap density than high quality deposited stoichiometric silicon dioxide ($SiO_2$) or aluminum oxide ($Al_2O_3$).

Example 1

Rare Earth Doped Alumina

When the host matrix material in which rare earth luminescent species are embedded is aluminum oxide (alumina, $Al_2O_3$) rather than silicon dioxide, a number of advantages ensue:

- Since alumina is also an oxide, rare earths will be bound to oxygen, so as to be in the correct chemical state to emit light, e.g. as a trivalent state, such as $Ce^{3+}$.
- The microstructure of alumina is such that octahedral cells are formed in which the rare earths can reside, with reduced clustering (C. E. Chryssou, et al, IEEE J. Quantum Electron. 34, 282 (1988)). Because they are strongly bound in these cells, they are unlikely to diffuse through the material, even at elevated temperatures, and therefore they are unlikely to cluster together. Clustering of two of more rare earths together changes their electronic or bonding configuration, so that they are no longer light emitters. The use of alumina helps to avoid this situation, allowing higher concentrations of rare earths, so they can be closer together, and rare earthed doped alumina is thus potentially a brighter light emitter.
- The physical properties of alumina are similar to silica (silicon dioxide). For example the breakdown field is important to electroluminescent devices, where high electric fields are present. The breakdown strength of alumina is similar to that of silica, ranging from 14 to 17 MV/cm for good quality material (see Yeong Yuh Chen, et al. IEEE Electron Dev. Lett. 24, 503 (2003).
- Other properties are distinctly more favourable for alumina over silica. The lower band gap (8.3 eV-8.7 eV vs. 9 eV for silicon) and the accompanying lower conduction band offset (2.8 eV vs. 3.05 eV for silica, with respect to silicon) enables easier electron injection and lower electric field operation.
- In addition, the higher dielectric constant (9.5 vs 3.9 for silica) can be of benefit if other materials are involved in a complete device structure. For example, if the dielectric constant of the active layer is higher than the drift layer, the electric field will be mostly dropped across the drift layer.
- Finally the much higher thermal conductivity of alumina (30 W/m-K vs. 1.5 W/m-K for silica) coupled with a similar heat capacity results in a much longer phonon mean free path in alumina and therefore less energy loss from energetic electrons.

Thus in the simple form of the device structure 1 as shown in FIG. 1A, the light emitting structure comprises a single active layer 12 of rare earth doped alumina ($Al_2O_3$), disposed between first and second metallic films, which form a first transparent electrode 21 of TCO, typically indium tin oxide ITO, or similar material, and a second electrode 25, which may for example be a metal layer, or doped semiconductor substrate material, e.g. silicon. At least one of the electrodes, e.g. 21 is transparent to transmit light emission from the structure. A DC or AC voltage is applied to the electrodes, across the alumina active layer 12 to excite the luminescent rare earth species in the active layer. Electrons are accelerated by the applied field and when they collide with the rare earth ions they transfer their energy to the rare earth species, which subsequently emit energy in the form of a photon. Almost any rare earth is suitable, but particularly useful species for visible light emission which may be used to for emission of a particular wavelength or color include terbium (green) europium (red), and cerium or thulium (blue). The alumina may be doped with more than one rare earth species to provide a combined emission of a specific color or white light.

In the device structure 2 shown in FIG. 2 having a single active layer 14 an additional insulating film or layer 13 is provided between the active layer of alumina and the electrode layers comprising undoped alumina. The insulating layers 13 are preferably silicon dioxide, but may be undoped aluminum oxide, or other good quality insulating (dielectric) material.

In each of these two structures 1 and 2 the thickness of the alumina layer may be from 10 nm to 1000 nm, and the concentration of rare earth species range from about 1% to 5% or more, and potentially as much as 30% if all octahedral cells in the alumina structure are occupied by a rare earth species. The insulating film thickness may be from 2 nm to 100 nm. In the upper range of rare earth concentrations, the active layer may be regarded as a mixed oxide of general structure $RE_xAl_yO_z$.

In a preferred embodiment, instead of a single thicker active layer of 10 nm to 100 nm, the active region comprises multiple, relatively thin, active layers 12 each comprising a rare earth dopant in an alumina host matrix material, similar to that shown in FIG. 4. The drift layers 13 may be provided by aluminum oxide, silicon dioxide or another good insulator. The total thickness is adjusted so that the applied voltage, usually dictated by the external power source provides the optimum electric field to best balance efficiency, brightness and lifetime. The structure may comprise from 2 to 50 or more layer pairs, each layer being in the range from 1 nm to 10 nm thick. Each drift layers may also be in the range from 2 nm to 10 nm thick, to provide the appropriate excitation energy for exciting light emission from a respective active layer. Doped and undoped aluminum oxide layers are preferably deposited by PECVD, or other method capable of forming a high quality, good dielectric layer, with low trap density.

Example 2

Rare Earth and Aluminum Co-Doped in Silicon Dioxide

Another material which provides a suitable host matrix material for the active material comprises aluminum doped silicon dioxide. Co-doping of rare earth luminescent species and aluminum into silicon dioxide provides advantages over rare earth doped silicon dioxide host material without aluminum doping by reducing clustering effects. Consequently it may be possible to dope layers with more than the 1 to 5% of rare earth dopants typically used, before clustering effects are observed. Not only does the aluminum doping inhibit clustering effects, when used with certain rare earth dopants, notably cerium, where the bandgap of the host affects the shape of the luminescence spectra, it has been observed that the emission wavelength of the active layer may be shifted in proportion to the amount of aluminum doping. Therefore appropriate selection of rare earth luminescent species and aluminum doping concentration provides for more control over the emission spectrum. This effect may be particularly beneficial in multilayer engineered structures, such as that shown in FIG. 4, where there is a plurality of active layers emitting different wavelengths.

In an example of structure using these materials in a device structure such as that shown in FIG. 4, each active layer 12 comprises a layer of rare earth and aluminum doped silicon dioxide, separated by drift layers 13 comprising, preferably undoped silicon dioxide, although other compatible dielectrics may be used. The active layers 12 may be doped with one or more rare earth species, of an appropriate concentration, to provide active layers emitting at specific different wavelengths. Additionally, at least one or more active layers are provided which are co-doped with aluminum in the same or different concentrations. For example, by adding specific amounts of aluminum to each of a plurality of individual rare earth doped active layers, the emission spectrum of each layer may be offset, i.e. shifted relative to other layers doped with the same rare earth dopant, but having a different concentration of aluminum dopant.

The overall emission spectrum from such a multilayer device is broader and for example, provides a broader spectrum over a particular color range, and/or provides for a better white when mixing colours, e.g. by extending range of wavelengths of emission from one or more rare earth species to provide a smoother more continuous spectrum when light emission from multiple layers is combined.

As mentioned above, in general increasing the concentration of the rare earth ion in a glass or silica host matrix material increases the strength of the optical effect up to a certain concentration only. One factor is the solubility limit, at which point one rare earth compound or another precipitates out of the matrix. Another threshold is the point at which the rare earth ions preferentially bond to one another, or at least or now longer bonded to the requisite number of oxygen atoms (typically 3) and may not stay uniformly dispersed. In both cases the total optical activity is typically diminished by the fact that an increasing proportion of the rare earth ions are no longer in the requisite valence state for light emission. The onset of the latter phenomenon is usually referred to as clustering and generally occurs at a lower concentration than the solubility limit and remains a major technical limitation to the performance of photonic devices made with rare earth doped glasses.

Rare earth clustering in silicon dioxide may be observed at concentrations of several atomic percent, e.g. for terbium doped silicon dioxide the maximum amount of Tb that can be incorporated without strong evidence of clustering, and thus reduced light emission, is between 2% and 3%. Below that point the brightness of the device increases with rare earth doping concentration, but beyond that limit limited further increase in brightness is achieved. Efficacy is similar affected. Thus in practice the maximum concentration of rare earth dopant, depending on which element, may be limited to 5 at. % or less.

The use of thinner, multilayer structures as shown in FIG. 4 described above is believed to intrinsically reduce the effects of clustering in that the rare earth ions in the active layer adjacent undoped drift regions have few unpaired rare earth ions on one side. In addition, optimization of process conditions such as deposition and post growth heat treatments may check the movement of rare earth ions that might otherwise cluster in equilibrium. Nevertheless such restrictions in design and process latitude may be undesirable in some applications.

In optically excited devices, it has been recognized that some phosphors and fibre based optical devices, addition of aluminum to silica inhibits rare earth clustering, and thereby increases luminescent yield, possibly by opening up the structure of $SiO_2$ and creating more sites where the rare earth ion may be incorporated in the required valence state. Nevertheless, these phenomena are distinct, i.e. optical excitation of emission is distinct from electroluminescence and current induced luminescence based on impact excitation by hot electrons, and other factors may contribute to the observed reduction in clustering effects and/or wavelength shifts in electroluminescent devices structures according to embodiments of the present invention. For example, when significant concentrations of aluminum are added to silicon dioxide, to form a mixed oxide that could be described as a mixed oxide of a general formula $Si_lAl_mO_n$, or a mixture of silica and alumina may exhibit of the advantages of aluminum oxide described in Example 1 with respect to electrical and other physical properties, which may also contribute to the observed effects and operational characteristics of a device comprising rare earth and aluminum co-doped silicon dioxide active layers.

For example, when tested in the device structure shown in FIG. 4, a wavelength shift of 30-40 nm (to shorter wavelength) was observed for cerium in aluminum oxide compared to silicon dioxide.

Example 3

Rare Earth Doped Silicon Oxynitrides of the General Structure $Si_aO_bN_c$

As described with respect to Examples 1 and 2 above, a multilayer structure may be provided comprising a plurality of active layers each comprising a rare earth doped host matrix material of a dielectric material selected to control clustering effects, allowing higher concentrations of rare earth species to be incorporated for higher brightness, and possibly improved efficiency, and/or for colour control. Thus in this example, each active layer comprises a dielectric of the general formula $Si_aO_bN_c$ in varying ratios, i.e. nitrogen containing oxides or silicon oxynitrides. The drift layers preferably comprise an appropriate thickness of silicon dioxide, as described above.

In these examples, addition of nitrogen to the rare earth doped layers provides a red shift in the emission spectrum of the rare earth luminescent species, e.g. cerium, and by adding judicious amounts of nitrogen the desired wavelength tuning or colour control can be achieved.

Figure 11:
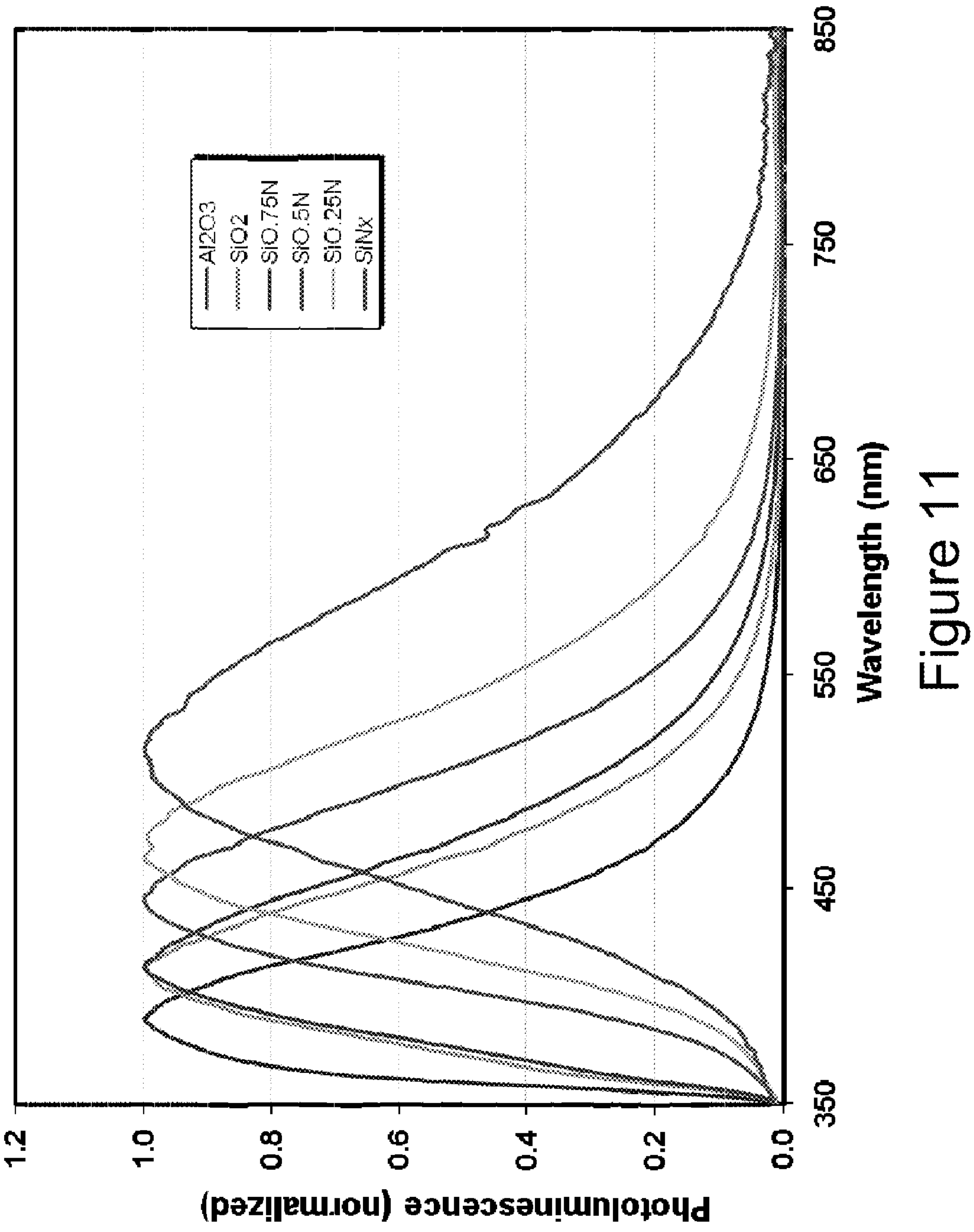
FIG. 11 shows emission spectra from emitter layer structures wherein active layers comprise a selected rare earth dopant (Ce) in different dielectric host matrix materials.

For example, FIG. 11 shows the emission spectrum of cerium in a number of different host matrix dielectric materials of differing proportions of Si, O and N, and in particular the ratio of oxygen to nitrogen in several oxynitrides is varied in the range 0.25:1, 0.5:1 and 0.75:1. Active layers comprising rare earth doped silicon oxynitride host matrix materials of different compositions may be used in combination with rare earth doped silicon dioxide or silicon nitride layers to provide a wider range of emission wavelengths. Significant wavelength shift of the peak of the emission was observed, from about 420 nm for silicon dioxide, to over 550 nm for silicon nitride, and a range of wavelengths in between for different oxynitride compositions.

Consequently a multilayer structure comprising several active layers of different host matrix composition with the same rare earth dopant, but different amounts of nitrogen can provide a broader spectrum of emission over a wider range of visible wavelengths. Cerium shows a particularly large dependence of emission on the host matrix material compared with other rare earth species tested.

Example 4

Rare Earth Doped Oxides of the General Structure $Si_aAl_bO_cN_d$ or SiAlON

Rare earth doped silicon oxynitrides as described in Example 3 may also be co-doped with aluminum. Thus in this example, each active layer comprises a dielectric of the general formula $Si_aAl_bO_cN_d$ in varying ratios, which may include nitrogen containing oxides, such as silicon oxynitrides, with or without aluminum doping.

In these active layers, addition of nitrogen provides a red shift in the emission spectrum of the rare earth luminescent species, e.g. cerium, and by adding judicious amounts of both Al and N the desired wavelength tuning or colour control, together with inhibition of clustering can be achieved.

For example, FIG. 9 which shows the emission spectrum of cerium in a number of different host matrix dielectric materials of differing proportions of Si, Al, O and N.

In Examples 3 and 4 above, wavelength shifts of up to 170 nm were observed for some material combinations, which provides significant capacity for tuning of the emission wavelength of single layer or multilayer emitter structures While examples are described for particular combinations of host matrix materials it will also be appreciated that in other embodiments structure may be provided with different combinations of host matrix dielectric materials selected from alumina, silicon dioxide with and without aluminum doping, silicon oxynitrides of various compositions (i.e. different oxygen to nitrogen ratios), silicon nitride, aluminum doped oxynitrides or various SiAlON compositions.

Co-Doping with Two or More Rare Earth Luminescent Centres

In some embodiments, one or more active layers may be co-doped with two or more rare earth luminescent species.

For example, in the multilayer structure of FIG. 4, the thickness of each drift layer is selected to provide an appropriate excitation energy matched to the excitation energy of a respective adjacent active layer, to provide more efficient excitation of the active layer. As explained above, because the resulting electron energy in practice has a narrow range of energies, nevertheless some electrons may be at the lower end of the range and some more energetic than the ideal excitation energy, but careful design and tuning of the structure to match the electron energy distribution to the electron excitation spectrum of the respective active layer provides improved efficiency and brightness, particularly in a multilayer structure. Since electrons with energies at the lower end of the range may be wasted, it may be beneficial to add a another rare earth co-dopant having a lower excitation energy to capture or "mop up" electrons which are at lower end of the energy distribution, and contribute to light emission. Similarly, a co-dopant with a higher excitation energy &/or higher capture cross section may be added to one or more active layers to capture hot electrons, and thereby reduce probability of hot electron damage to the emitter structure or electrode layers, while also contributing to light emission. Thus these rare earth co-dopants may also be selected to control or enhance the spectrum of light emission, as well as to improve the overall luminous efficacy of the device structure.

In each of the embodiments described above, suitable rare earth luminescent centres include one or more elements of the lanthanide series, such as one or more of: Ce, Pr, Nd, Sm, Eu, Gd, Tb, Dy, Ho, Er, Tm or Yb. Cerium, thulium, terbium and europium may be preferred. Suitable concentrations may be in concentrations from 1% to 5%, although higher concentrations may be possible in some dielectric host matrix materials e.g. in alumina or aluminum doped dielectrics where clustering is inhibited.

Fabrication Process

A preferred method for deposition of a multilayer emitter structure, such as shown in FIG. 4, is PECVD, although other process mentioned above may be suitable if they are capable of providing thin layers of 1 nm to 10 nm of high quality deposited oxides or dielectrics, with low trap density and appropriate physical and electrical properties for operation at the electric fields required for current flow at fields of ~4 MV/cm to 10 MV/cm.

$Si_aAl_bO_cN_d$

For structures deposited with a plurality of active layers doped with one or more different rare earth luminescent species, in host matrix material wherein the composition $Si_aAl_bO_cN_d$ varies so as to provide a spectrum shift dependent on composition, successive layers may be deposited in a suitable reactor providing for the ratio of reactant gases providing each component, i.e. the rare earth precursor, silicon, aluminum, oxygen or nitrogen, to be varied from layer to layer, from 0 at. % to a desired maximum at. % of each component. Conveniently, the drift layers comprise undoped silicon dioxide or dielectric layers of a similar material to the active layers, although typically nitrogen containing dielectrics are not preferred for the drift layers since they tend to have a higher trap density. Thus, silicon dioxide may be preferred as a drift layer with alumina, with $Si_aAl_bO_cN_d$ or other dielectrics providing the host matrix material; or the drift layer may be the same material as the corresponding active layer, but without rare earth dopant. Nitrogen may be beneficially added to the active layer matrix material for wavelength shift and spectrum control. Aluminum is beneficially added to the active layer for spectrum control and or to reduce clustering. Two or more rare earth species may be co-doped into the same active layer by introducing a suitable mixture of rare earth precursor into the reaction chamber.

Depending on the deposition process, an annealing process may be required. Further details of processes for deposition and annealing of such layers, suitable precursors, et al. may be found in U.S. patent publication No. 2007/181906. Although this application primarily refers to deposition of silicon rich oxides or nitrides containing nanoparticles, it will be appreciated that more generally (without carbon doping) appropriate ratios of reactants provide for deposition of stoichiometric oxides, or oxides of the appropriate structure $Si_aAl_bO_cN_d$ with different values of a, b, c, and d, as described above, e.g. aluminum oxide, silicon dioxide, aluminum doped silicon dioxide, or silicon oxynitrides, with and without aluminum doping. Trimethyl aluminum (TMA) is typically used as an aluminum precursor. For deposition of rare earth oxides, ALD may be a preferred method.

In referring above to general structures e.g. $Si_aAl_bO_cN_d$, it is to be understood that the ratios of Si, Al, O, and N in each layer, i.e. the values a, b, c, d (or alternatively w, x, y, z et al.) may be selected or varied independently and may differ in each layer to provide layers of different compositions with appropriate optical and/or electrical properties. In referring to the composition $Si_aAl_bO_cN_d$, values of a, b, c or d may be zero in some layers, to provide a binary or ternary compositions, e.g. RE doped or undoped $Al_2O_3$, $Si_xAl_yO_z$ or silicon oxynitrides $SiO_xN_y$, $SiO_2$, $Si_3N_4$. Layers doped with a rare earth species RE, may be denoted as RE:$Si_aAl_bO_cN_d$, or RE:$Al_2O_3$, for example.

For structures comprising active layers provided by rare earth doped aluminum oxide, preferably the drift layers may be provided by undoped aluminum oxide or silicon dioxide. Aluminum oxide may also be deposited by processes such as PECVD and its variants (ECR-PECVD, ICP-PECVD), ALD, and sputtering—in general the same processes as for deposition of silicon dioxide.

Alternative Embodiments

While the embodiments described above are directed to devices, emitter structures and electroluminescent active layers comprising rare earth doped dielectrics for emitting white light or coloured light, it will be appreciated that such electroluminescent emitter structures may be provided which emit in the shorter wavelength range of visible light, i.e. blue (cerium) or uv (gadolinium) emission, and may be used to optically excite an emissive layer or a thin film phosphor layer. Such a phosphor layer may provided on top of an electrically excited emitter layer structure as described above, to provide emission at other wavelengths, e.g. by down conversion.

INDUSTRIAL APPLICABILITY

Embodiments of an electroluminescent light emitting structure fabricated with materials compatible with silicon-based process technology are disclosed. Preferred materials and compositions are disclosed for active layers comprising a dielectric host matrix material containing rare earth luminescent centres, and respective drift layers, of a light emitting structure, which provide high brightness and/or improved colour control, that is control over emission wavelength, or spectrum of multi-layered engineered structures for solid state light emitters. In a multilayer structure wherein active layers comprise different host matrix materials doped with a particular rare earth species, host induced spectrum shifts may be used to fine tune the colour of emission from the structure. Appropriate selection of materials and compositions, believed to reduce clustering or rare earth species which leads to quenching relaxation effect, provides improved brightness of visible emission. Some preferred structures and materials also offer improved performance, such as higher luminous efficacy, brightness, and reliability for solid state lighting applications.

All publications, patents and patent applications cited in this specification are herein incorporated by reference as if each individual publication, patent or patent application were specifically and individually indicated to be incorporated by reference. The citation of any publication is for its disclosure prior to the filing date and should not be construed as an admission that the present invention is not entitled to antedate such publication by virtue of prior invention. All patents and patent applications referred to above are herein incorporated by reference.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An electroluminescent light emitting structure comprising:

an active layer comprising rare earth luminescent centers in a dielectric host matrix for emitting light of a characteristic wavelength, and electrodes for applying an electric field for excitation of light emission;

wherein the dielectric host matrix is selected from the group consisting of aluminum oxide, aluminum doped silicon dioxide, silicon oxynitrides, aluminum containing oxides of the general formula $Si_aAl_bO_c$, and aluminum containing oxynitrides of the general formula $Si_aAl_bO_cN_d$.

2. An electroluminescent light emitting structure according to claim 1 further comprising:

a drift layer comprising a wide bandgap semiconductor or dielectric material adjacent the active layer, the drift layer having thickness relative to the electric field dependent on a respective excitation energy of the adjacent active layer, for controlling electron energy gain from the electric field for exciting light emission at the characteristic wavelength.

3. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein each of the plurality of active layers comprises a dielectric host matrix selected from the group consisting of silicon dioxide, silicon nitride, rare earth oxides, aluminum oxide, aluminum doped silicon dioxide, silicon oxynitrides, aluminum doped silicon oxynitrides, aluminum containing oxides of the general formula $Si_xAl_yO_z$, and aluminum containing oxynitrides of the general formula $Si_aAl_bO_cN_d$.

4. An electroluminescent light emitting structure according to claim 3, wherein each drift layer has thickness relative to the electric field dependent on the respective excitation energy of an adjacent active layer, for controlling electron energy gain from the electric field for exciting light emission at the characteristic wavelength.

5. An electroluminescent light emitting structure according to claim 3 wherein the dielectric host matrix comprises one of silicon dioxide, silicon nitride or silicon oxynitride and corresponding drift layers comprise silicon dioxide or silicon nitride.

6. An electroluminescent light emitting structure according to claim 3 wherein the rare earth luminescent centres comprise one or more of Ce, Pr, Nd, Sm, Eu, Gd, Tb, Dy, Ho, Er, Tm or Yb.

7. An electroluminescent light emitting structure according to claim 3 wherein each active layer has a thickness from 1 nm to 10 nm.

8. An electroluminescent light emitting structure according to claim 3 wherein each drift layer has a thickness from 2 nm to 10 nm.

9. An electroluminescent light emitting structure according to claim 3 wherein the electrodes comprise first and second electrode layers, and the layer stack is disposed between first and second electrode layers for applying the electric field for excitation of luminescent centers, wherein at least one of said first and second electrode layers comprises a current injection layer.

10. An electroluminescent light emitting structure according to claim 9 wherein at least one of the first and second electrode layers comprises a material transparent at wavelengths emitted by the layer stack.

11. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein the plurality of active layers comprises a first active layer for emitting light of a first wavelength on excitation with a respective first excitation energy, a second active layer for emitting light of a second wavelength on excitation with a respective second excitation energy, and a third active layer for emitting light of a third wavelength on excitation by a respective third excitation energy.

12. An electroluminescent light emitting structure according to claim 11 wherein the first and second active layer comprises a similar dielectric host matrix, and luminescent centres in the first active layer comprise a first rare earth species for emitting light at the first wavelength and luminescent centres in the second active layer comprise a second rare earth species for emitting light at the second wavelength.

13. An electroluminescent light emitting structure according to claim 11 wherein the first and second active layers comprise a rare earth luminescent species having a host dependent emission spectrum, and the first active layer comprises said rare earth luminescent species in a first dielectric host matrix for emitting the first wavelength, and the second active layer comprises said rare earth luminescent species in a second dielectric host matrix for emitting the second wavelength.

14. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein the plurality of active layers emit light of different wavelengths which combine to provide white light of a desired colour rendering index.

15. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein the plurality of active layers comprises a first active layer for emitting light of a first wavelength on excitation with a respective first excitation energy, a second active layer for emitting light of a second wavelength on excitation with a respective second excitation energy; and wherein a corresponding first drift layer adjacent each first active layer comprises a dielectric material of a first thickness, and a corresponding second drift layer adjacent each second active layer comprises a dielectric material of a second thickness.

16. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein each drift layer has a thickness is substantially equal to the respective excitation energy for an adjacent active layer divided by the electric field.

17. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein the dielectric host matrix comprises aluminum oxide and the corresponding drift layers comprise a dielectric selected from the group consisting of silicon dioxide, aluminum oxide, or aluminum doped silicon dioxide.

18. An electroluminescent light emitting structure according to claim 17 where the active layer comprises a concentration of rare earth luminescent centers in the range from 1 at. % to 30 at. %.

19. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein the dielectric host matrix material in at least one active layer comprises aluminum doped silicon dioxide, and the respective drift layers comprise silicon dioxide.

20. An electroluminescent light emitting structure according to claim 19 wherein the dielectric host matrix material in at least one active layer further comprises nitrogen.

21. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein said active layers comprises rare earth luminescent centres in a dielectric host matrix material comprising a material of the general formula $Si_aAl_bO_cN_d$, and corresponding drift layers adjacent each active layer comprise a dielectric material of a general formula $Si_xAl_yO_z$.

22. An electroluminescent light emitting structure comprising:

a layer stack comprising:

a plurality of active layers, each comprising rare earth luminescent centers in a dielectric host matrix for emitting light of a characteristic wavelength on excitation with a respective excitation energy; and a corresponding drift layer comprising a dielectric material adjacent each active layer; and electrodes for applying an electric field to the layer stack for excitation of light emission;

wherein selected active layers are co-doped with two or more different rare earth luminescent species.

23. An electroluminescent light emitting structure according to claim 22 wherein an active layer comprises a primary rare earth dopant having a respective primary excitation energy, and another rare earth dopant having a lower excitation energy, and wherein the corresponding drift layer has a thickness matched to the respective primary excitation energy of the primary rare earth dopant.

* * * * *